(12) United States Patent
Han

(10) Patent No.: US 8,588,002 B2
(45) Date of Patent: Nov. 19, 2013

(54) NONVOLATILE MEMORY DEVICES AND PROGRAMMING METHODS THEREOF IN WHICH A PROGRAM INHIBIT VOLTAGE IS CHANGED DURING PROGRAMMING

(75) Inventor: Jinman Han, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 136 days.

(21) Appl. No.: 12/830,903

(22) Filed: Jul. 6, 2010

(65) Prior Publication Data

US 2011/0013457 A1 Jan. 20, 2011

(30) Foreign Application Priority Data

Jul. 15, 2009 (KR) .................. 10-2009-0064619

(51) Int. Cl.
*G11C 16/04* (2006.01)
(52) U.S. Cl.
USPC ............. 365/185.18; 365/185.03; 365/185.19
(58) Field of Classification Search
USPC ............. 365/185.03, 185.17, 185.18, 185.19, 365/189.011, 195
See application file for complete search history.

(56) References Cited

U.S. PATENT DOCUMENTS

| | | | |
|---|---|---|---|
| 5,768,188 A * | 6/1998 | Park et al. ................ | 365/185.03 |
| 6,278,636 B1 * | 8/2001 | Lee ......................... | 365/189.15 |
| 6,888,758 B1 | 5/2005 | Hemink et al. | |
| 7,672,166 B2 * | 3/2010 | Park et al. ................ | 365/185.19 |
| 7,764,542 B2 * | 7/2010 | Edahiro et al. ........... | 365/185.03 |
| 2005/0157552 A1 | 7/2005 | Hemink et al. | |
| 2007/0035996 A1 | 2/2007 | Nakagawa et al. | |
| 2008/0151633 A1 | 6/2008 | Park et al. | |
| 2008/0298129 A1 | 12/2008 | Tanaka et al. | |
| 2011/0058424 A1 * | 3/2011 | Goda et al. ............... | 365/185.19 |

FOREIGN PATENT DOCUMENTS

| | | |
|---|---|---|
| JP | 10-083688 A | 3/1998 |
| JP | 2003-196988 A | 7/2003 |
| JP | 2007-042166 A | 2/2007 |
| JP | 2007-519161 A | 7/2007 |
| JP | 2008-159244 A | 7/2008 |
| KR | 10-0467410 B1 | 1/2005 |
| KR | 10-0845135 B1 | 7/2008 |
| KR | 10-2009-0048763 * | 5/2009 |

* cited by examiner

*Primary Examiner* — Vanthu Nguyen

(74) *Attorney, Agent, or Firm* — Myers Bigel Sibley & Sajovec, P.A.

(57) ABSTRACT

Provided are nonvolatile memory devices and programming methods thereof. A non-volatile memory device is programmed by performing a plurality of programming loops on memory cells in a memory cell array and changing a program inhibit voltage applied to bit lines of the memory cells that have completed programming while performing the plurality of programming loops.

25 Claims, 23 Drawing Sheets

NONVOLATILE MEMORY DEVICES AND PROGRAMMING METHODS THEREOF IN WHICH A PROGRAM INHIBIT VOLTAGE IS CHANGED DURING PROGRAMMING

CROSS-REFERENCE TO RELATED APPLICATION

This U.S. non-provisional patent application claims priority under 35 U.S.C. §119 of Korean Patent Application No. 10-2009-0064619, filed on Jul. 15, 2009, the entire contents of which are hereby incorporated by reference.

BACKGROUND

The present invention disclosed herein relates generally to semiconductor memory devices, and more particularly, to nonvolatile memory devices and programming methods thereof.

Semiconductor memory devices are generally categorized into volatile memory devices (e.g., DRAMs and SRAMs) and nonvolatile memory devices (e.g., EEPROMs, FRAMs, PRAMs, MRAMs, and flash memories). A volatile memory device loses stored data when the power supply is interrupted; whereas a nonvolatile memory device retains stored data even when the power supply is interrupted. In particular, a flash memory is widely used as a storage medium in a computer system because of its high program speed, low power consumption and large storage capacity.

A flash memory may store 1-bit data or 2-bit or more data in one memory cell. In general, a memory cell storing 1-bit data is called a single level cell (SLC), and a memory cell storing 2-bit or more data is called a multi level cell (MLC). The SLC has an erase state and a program state according to a threshold voltage, and the MLC has an erase state and a plurality of program states according to a threshold voltage.

During a program-verify operation, bit lines that have been programmed are typically driven to an inhibit voltage level, which may be at the power supply voltage level. The bit lines are driven to the inhibit voltage level to reduce the likelihood that they may be reprogrammed by a subsequent programming loop. A higher inhibit voltage level can reduce the number of programming failures, but at the expense of increasing power consumption due to an increase in the current generated by driving the bit lines to a higher voltage level.

SUMMARY

It should be appreciated that this Summary is provided to introduce a selection of concepts in a simplified form, the concepts being further described below in the Detailed Description. This Summary is not intended to identify key features or essential features of this disclosure, nor is it intended to limit the scope of the invention.

According to some embodiments of the present invention, a non-volatile memory device is programmed by performing a plurality of programming loops on memory cells in a memory cell array and changing a program inhibit voltage applied to bit lines of the memory cells that have completed programming while performing the plurality of programming loops.

In other embodiments, changing the program inhibit voltage comprises increasing the program inhibit voltage applied to the bit lines of the memory cells that have completed programming.

In still other embodiments, each of the bit lines of the memory cells has a bit line shut-off transistor coupled thereto. Changing the program inhibit voltage comprises changing a voltage (BLSHF) applied to respective gates of ones of the bit line shut-off transistors such that the program inhibit voltage is driven to BLSHF minus a threshold voltage (Vth) of respective ones of the bit line shut-off transistors.

In still other embodiments, each of the bit lines of the memory cells has a string selection transistor coupled thereto. The method further comprises setting a string selection voltage (VSSL) applied to respective gates of ones of the string selection transistors to a level lower than the program inhibit voltage applied to the bit lines coupled to the string selection transistors, respectively.

In still other embodiments, changing the program inhibit voltage comprises changing the program inhibit voltage based on a number of memory cells that have completed programming.

In still other embodiments, the program inhibit voltage is less than an internal power supply voltage used in the nonvolatile memory device.

In still other embodiments, the program inhibit voltage is a first value during the performance of a first subset of the plurality of programming loops and the program inhibit voltage is a second value during the performance of a second subset of the plurality of programming loops. The second subset of the plurality of programming loops are performed subsequent to the first subset of the plurality of programming loops and the second program inhibit voltage value is greater than the first program inhibit voltage value.

In still other embodiments, changing the program inhibit voltage comprises changing the program inhibit voltage one time while performing the plurality of programming loops.

In still other embodiments, changing the program inhibit voltage comprises changing the program inhibit voltage multiple times while performing the plurality of programming loops.

In still other embodiments, changing the program inhibit voltage comprises increasing the program inhibit voltage while performing the plurality of programming loops at a frequency corresponding to increases in a programming voltage during performance of the plurality of programming loops.

In still other embodiments, changing the program inhibit voltage comprises increasing the program inhibit voltage during the performance of a first subset of the plurality of programming loops and maintaining the program inhibit voltage at approximately a same value during the performance of a second subset of the plurality of programming loops. The second subset of the plurality of programming loops is performed subsequent to the first subset of the plurality of programming loops.

In still other embodiments, increasing the program inhibit voltage comprises increasing the program inhibit voltage during performance of the first subset of the plurality of programming loops at a frequency corresponding to increases in a programming voltage during performance of the first subset of the plurality of programming loops.

In still other embodiments, changing the program inhibit voltage comprises maintaining the program inhibit voltage at approximately a same value during the performance of a first subset of the plurality of programming loops and increasing the program inhibit voltage during the performance of a second subset of the plurality of programming loops. The second subset of the plurality of programming loops is performed subsequent to the first subset of the plurality of programming loops.

In still other embodiments, increasing the program inhibit voltage comprises increasing the program inhibit voltage during performance of the second subset of the plurality of programming loops at a frequency corresponding to increases in a programming voltage during performance of the second subset of the plurality of programming loops.

In still other embodiments, changing the program inhibit voltage comprises maintaining the program inhibit voltage at approximately a first same value during the performance of a first subset of the plurality of programming loops, increasing the program inhibit voltage during the performance of a second subset of the plurality of programming loops, and maintaining the program inhibit voltage at approximately a second same value during the performance of a third subset of the plurality of programming loops. The third subset of the plurality of programming loops is performed subsequent to the second subset of the plurality of programming loops, which is performed subsequent to the first subset of the plurality of programming loops.

In still other embodiments, increasing the program inhibit voltage comprises increasing the program inhibit voltage during performance of the second subset of the plurality of programming loops at a frequency corresponding to increases in a programming voltage during performance of the second subset of the plurality of programming loops.

In still other embodiments, changing the program inhibit voltage comprises increasing the program inhibit voltage during the performance of a first subset of the plurality of programming loops, maintaining the program inhibit voltage at approximately a same value during the performance of a second subset of the plurality of programming loops, and increasing the program inhibit voltage during the performance of a third subset of the plurality of programming loops. The third subset of the plurality of programming loops are performance subsequent to the second subset of the plurality of programming loops, which are performed subsequent to the first subset of the plurality of programming loops.

In still other embodiments, increasing the program inhibit voltage during the performance of the first subset of the plurality of programming loops comprises increasing the program inhibit voltage during performance of the first subset of the plurality of programming loops at a frequency corresponding to increases in a programming voltage during performance of the first subset of the plurality of programming loops. Increasing the program inhibit voltage during the performance of the third subset of the plurality of programming loops comprises increasing the program inhibit voltage during performance of the third subset of the plurality of programming loops at a frequency corresponding to increases in a programming voltage during performance of the third subset of the plurality of programming loops.

In still other embodiments, the method further comprises determining a number of the memory cells to be programmed. Changing the program inhibit voltage comprises changing the program inhibit voltage when the number of memory cells to be programmed exceeds a threshold.

In further embodiments of the present invention, a memory system comprises a non-volatile memory cell array comprising and a control logic unit that is configured to cause a plurality of programming loops to be performed memory cells of the memory cell array and to change a program inhibit voltage applied to bit lines of the memory cells that have completed programming while the plurality of programming loops are performed.

In still further embodiments, each of the bit lines of the memory cells has a bit line shut-off transistor coupled thereto and wherein the control logic unit is further configured to change the program inhibit voltage by changing a voltage (BLSHF) applied to respective gates of ones of the bit line shut-off transistors such that the program inhibit voltage is driven to BLSHF minus a threshold voltage (Vth) of respective ones of the bit line shut-off transistors.

In still further embodiments, the memory cell array is part of a flash memory.

In still further embodiments, the flash memory comprises a NAND, NOR, or a One_NAND type flash memory.

In still further embodiments, the memory system is embodied in a memory card device, Solid State Drive (SSD) device, ATA bus device, Serial ATA (SATA) bus device, Small Computer System Interface (SCSI) device, Serial Attached SCSI (SAS) device, Multi-Media Card (MMC) device, Secure Digital (SD) device, memory stick device, Hard Disk Drive (HDD) device, Hybrid Hard Drive (HHD) device, or a Universal Serial Bus (USB) flash drive device.

In still further embodiments, the memory system is embodied in a graphics card, a computer, a mobile terminal, a Personal Digital Assistant (PDA), a camera, a game console, an MP3 player, a television, a DVD player, a router, or a GPS system.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION

Figure 1:
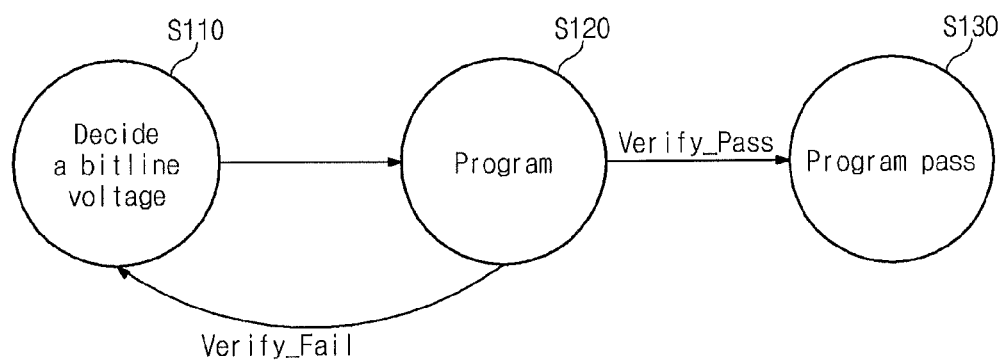
FIG. 1 is a state diagram that methods of programming a nonvolatile device according to some embodiments of the present inventive subject matter.

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like reference numbers signify like elements throughout the description of the figures.

As used herein, the singular forms "a," "an," and "the" are intended to include the plural forms as well, unless expressly stated otherwise. It should be further understood that the terms "comprises" and/or "comprising" when used in this specification is taken to specify the presence of stated features, integers, steps, operations, elements, and/or components, but does not preclude the presence or addition of one or more other features, integers, steps, operations, elements, components, and/or groups thereof. It will be understood that when an element is referred to as being "connected" or "coupled" to another element, it can be directly connected or coupled to the other element or intervening elements may be present. Furthermore, "connected" or "coupled" as used herein may include wirelessly connected or coupled. As used herein, the term "and/or" includes any and all combinations of one or more of the associated listed items.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

For purposes of illustration, various embodiments of the present subject matter are described herein with reference to a memory system comprising a flash memory data storage device. It will be understood that the data storage device is not limited to implementation as a flash memory device, but can be implemented generally as an erase before write memory device. Also, it will be understood that the data storage device is not limited to implementation as a non-volatile memory device, and can be implemented as a volatile memory device, such as a dynamic random access memory (DRAM), and so on. The data storage device may be a memory card device, Solid State Drive (SSD) device, ATA bus device, Serial ATA (SATA) bus device, Small Computer System Interface (SCSI) device, Serial Attached SCSI (SAS) device, Multi-Media Card (MMC) device, Secure Digital (SD) device, memory stick device, Hard Disk Drive (HDD) device, Hybrid Hard Drive (HHD) device, and/or a Universal Serial Bus (USB) flash drive device.

Hereinafter, exemplary embodiments of the present invention will be described in detail with reference to the accompanying drawings.

FIG. 1 is a state diagram that illustrates methods of programming a nonvolatile device according to some embodiments of the present inventive subject matter. In state S110 a program inhibit voltage is selected for use during one or more programming loops, which occur in state S120. During the verify phase, cells will be evaluated to determine if they have reached their target state or not. If a memory cell has reached its target state, then the cell is considered to have passed as represented by state S130. If a memory cell has not reached its target state, then the cell is considered to have failed. The process may then repeat with the program inhibit voltage possibly changed to a different value.

Figure 2A:
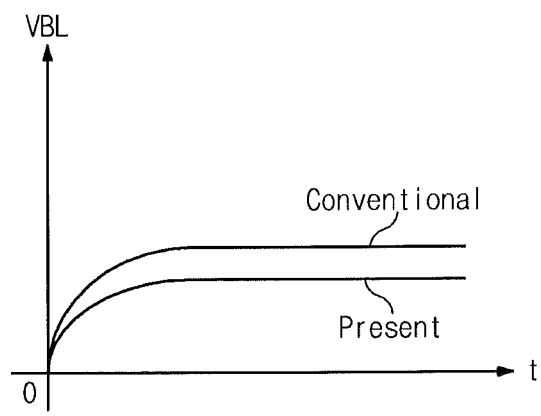
FIGS. 2A and 2B are voltage and current waveforms, respectively, that contrast program inhibit bit line voltage and current according to some embodiments of the present inventive subject matter with bit line voltage and current in conventional nonvolatile memory devices.
Figure 2B:
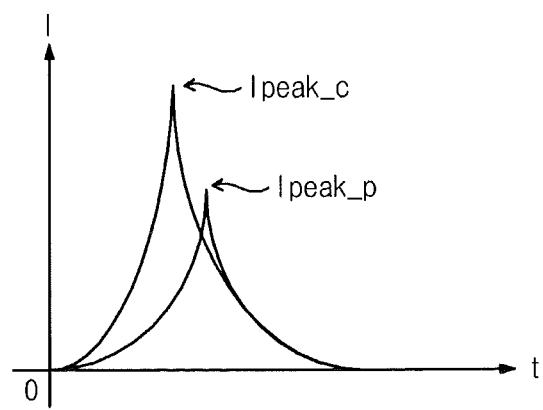

According to some embodiments of the present inventive subject matter, the program inhibit voltage can be reduced based on various factors, such as, but not limited to, the number of cells remaining to be programmed and the level of the programming voltage. As shown in FIG. 2A, the program inhibit voltage applied to a bit line may be less than that used in conventional memory devices during some programming loops. As a result, the peak current may be less as shown in FIG. 2B, which may reduce power consumption.

Figure 3:
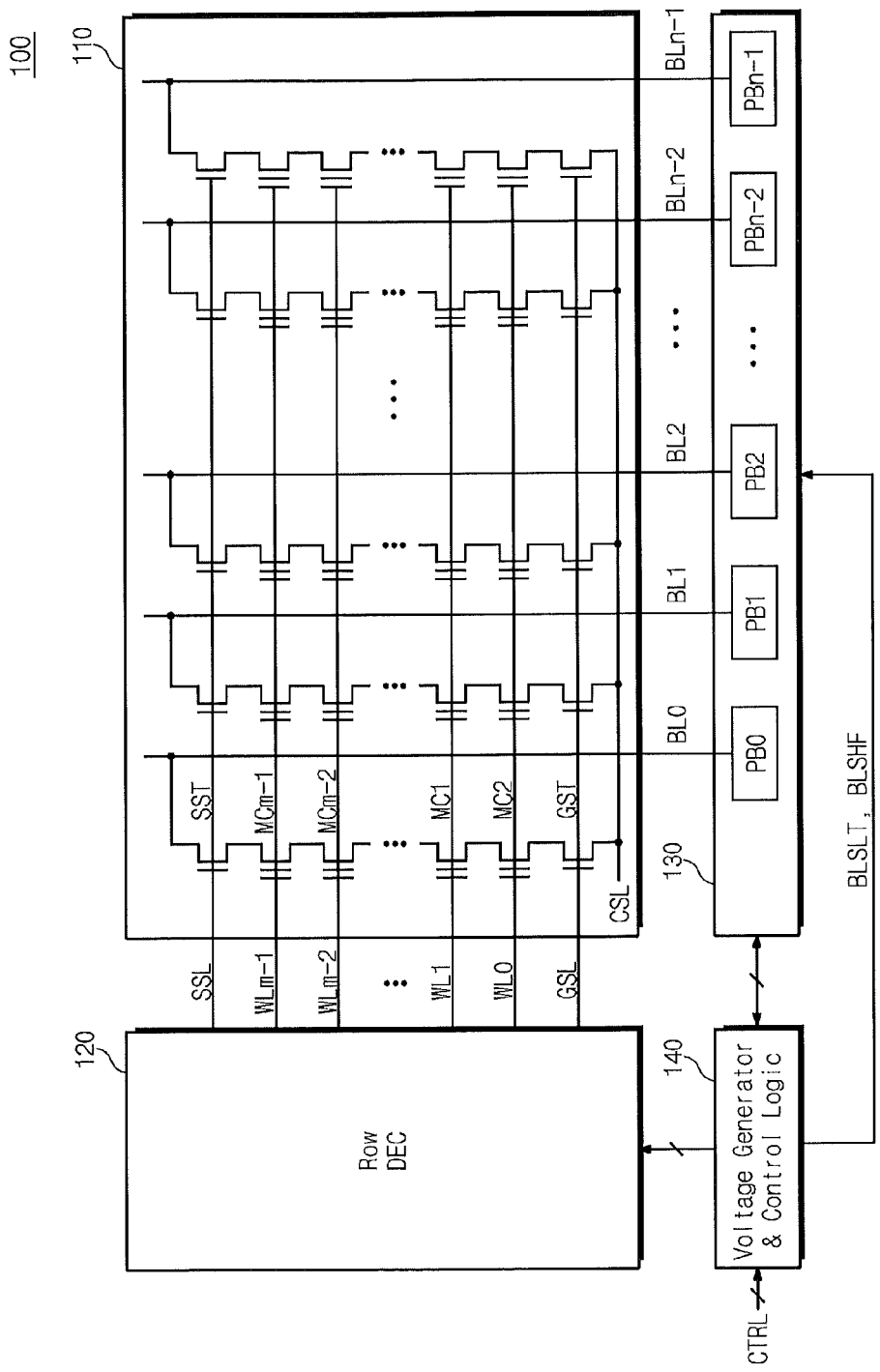
FIG. 3 is a block diagram of a nonvolatile memory device according to some embodiments of the present inventive subject matter.

FIG. 3 is a block diagram of a nonvolatile memory device according to some embodiments of the present inventive subject matter. In FIG. 3, a flash memory device is exemplified as a nonvolatile memory device.

Referring to FIG. 3, a nonvolatile memory device 100 includes a memory cell array 110, a row/address decoder 120, a data input/output circuit 130, and a voltage generator/control logic unit 140. In some embodiments, the nonvolatile memory device 100 comprises a flash memory, which may be a NAND, NOR, and/or a One_NAND type flash memory.

The memory cell array 110 may include a plurality of memory blocks. As an example, one memory block is illustrated in FIG. 3. Each memory block may include a plurality of pages. Each page (e.g., 111) may include a plurality of memory cells (e.g., A~E), The nonvolatile memory device 100 may perform an erase operation on a block basis and may perform a write or read operation on a page basis.

Each memory cell may store 1-bit data or 2-bit or more data. A memory cell capable of storing 1-bit data is called a single level cell (SLC) or a single bit cell, and a memory cell capable of storing 2-bit or more data is called a multi level cell (MLC) or a multi bit cell. The SLC has an erase state or a program state according to a threshold voltage. The MLC has an erase state or one of a plurality of program states according to a threshold voltage.

Referring to FIG. 3, the memory cell array 110 has a cell string structure. A cell string includes a string selection transistor connected to a string selection line SSL, a plurality of memory cells connected to a plurality of word lines WL0~WL31, and a ground selection transistor connected to a ground selection line GSL. The string selection transistor is connected to a bit line BL, and the ground selection transistor is connected to a common source line CSL.

A plurality of memory cells A, B, C, D and E may be connected to a word line (e.g., WLs). For the convenience of description, five memory cells are illustrated in FIG. 1. However, more memory cells may be connected to a word line. A set of memory cells A, B, C, D and E, which are connected to the selected word line WLs and programmed simultaneously, is generally called a page.

Referring to FIG. 3, the address decoder 120 is connected to the memory cell array 110 through the selection lines SSL and CSL and the word lines WL0~WL31. In a program or read operation, the row/address decoder 120 receives an address ADDR and selects a word line (e.g., WLs). Meanwhile, the address decoder 120 transfers a bias voltage for a program or read operation to the selected word line WLs or the unselected word lines (i.e., all but the WLs).

The data input/output circuit 130 is connected through the bit lines BL1~BL5 to the memory cell array 110. In a program operation, the data input/output circuit 130 receives data DATA from the outside and transfers program data to a selected page. In a read operation, the data input/output circuit 130 reads data from a selected page and outputs data DATA to the outside.

The data input/output circuit 130 includes a plurality of page buffers PB0~PBn–1. The page buffers PB0~PBn–1 may temporarily store the data to be programmed into a selected page or the data read from a selected page. The data stored in each page buffer (e.g., PB1) is programmed into a selected memory cell through the bit line (e.g., BL1).

The voltage generator/control logic unit 140 may control a program/read/erase operation of the nonvolatile memory device 100. For example, in a program operation, the control logic unit 140 may control the row/address decoder 120 to provide a program voltage to the selected word line WLs and may control the data input/output circuit 130 to provide program data to a selected page. The voltage generator/control logic unit 140 may perform a program/read/erase operation responsive to an external control signal CTRL. The voltage generator/control logic unit 140 may also generate control signals BLSLT and BLSHF to control bit line driver circuits in the page buffers PB0~PBn–1. These bit line driver circuits may be used to set the program inhibit voltage applied to bit lines of memory cells that have completed programming.

Figure 4:
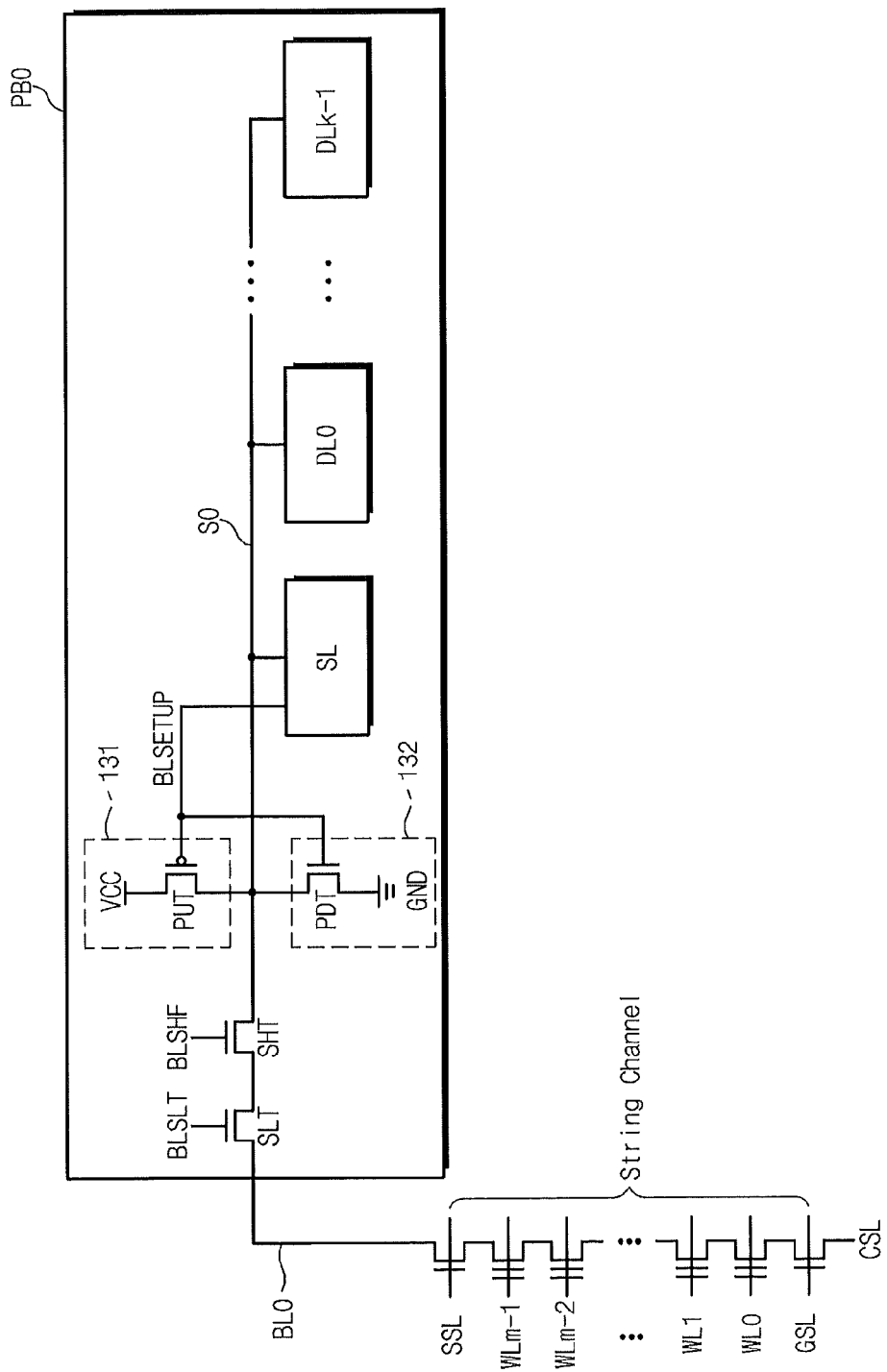
FIG. 4 is a schematic of a bit line driver circuit according to some embodiments of the present inventive subject matter.

FIG. 4 is a schematic of a bit line driver circuit according to some embodiments of the present inventive subject matter. In particular, FIG. 4 shows a bit line driver circuit disposed in page buffer PB0, which is connected to bit line BL0 of FIG. 3. The bit line driver circuit includes a pull up circuit 131 and a pull down circuit 132 that drive a sensing node SO to VCC or GND responsive to a signal BLSETUP. Attached to the sensing node SO are a sensing latch SL, which senses the level of the bit line voltage BL0 and data latches DL0~DLk–1, which latch memory cell data. The bit line driver circuit further comprises a shut-off transistor SHT and an isolation transistor SLT that are connected in series between the sensing node SO and the bit line BL0. The isolation transistor SLT may be used to isolate the bit line BL0 from the page buffer PB0 responsive to the signal BLSLT. The shut-off transistor SHT may be used to change the program inhibit voltage that is applied to the bit line BL0. Rather than drive the bit line BL0 to VCC as a program inhibit voltage, the program inhibit voltage can be set based on the voltage BLSH applied to the gate terminal of the shut-off transistor SHT.

Figure 5:
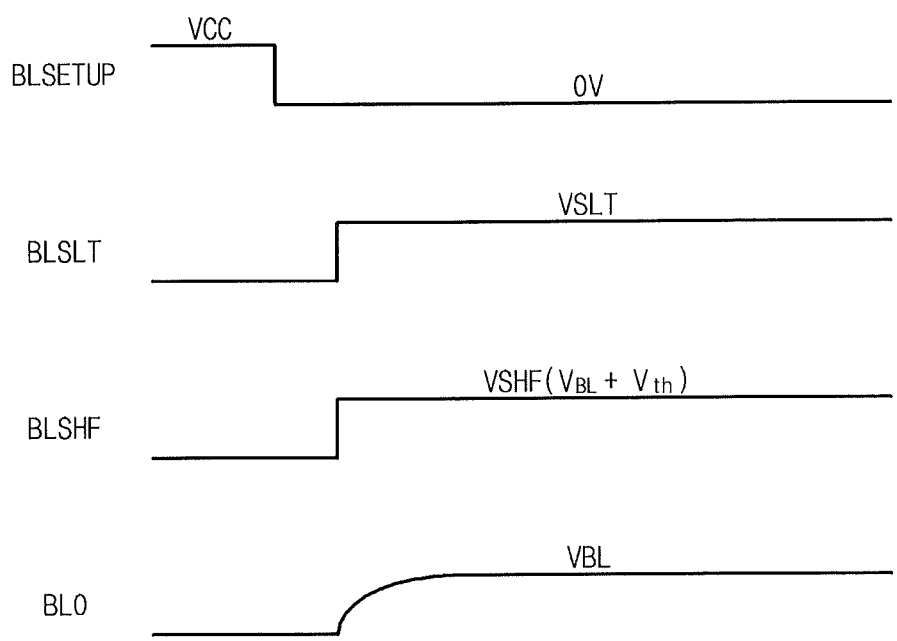
FIG. 5 is a set of waveform diagrams that illustrate the application of a program inhibit voltage to a bit line in accordance with some embodiments of the present inventive subject matter.

FIG. 5 is a set of waveform diagrams that illustrate the application of a program inhibit voltage to a bit line in accordance with some embodiments of the present inventive subject matter. As shown in FIG. 5, the BLSETUP signal is driven low so that the sensing node SO is pulled up to the supply voltage VCC. The BLSLT signal is driven high so as to connect the page buffer to the bit line via the isolation transistor SLT. The BLSHF signal is driven to a level VSHF corresponding to the desired bit line voltage level VBL plus the threshold voltage of the shut-off transistor SHT (Vth). Thus, the bit line need not be driven to the supply voltage level VCC as the program inhibit voltage, but can be driven to a lower level based on the voltage level of the signal BLSHF.

Figure 6:
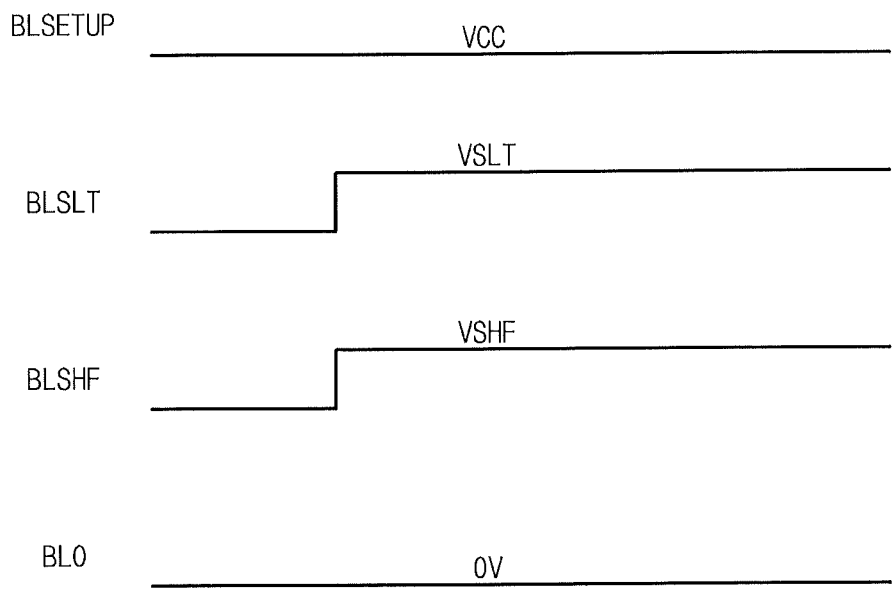
FIG. 6 is a set of waveform diagrams that illustrate the application of a program voltage to a bit line in accordance with some embodiments of the present inventive subject matter.

FIG. 6 is a set of waveform diagrams that illustrate the application of a program voltage to a bit line in accordance with some embodiments of the present inventive subject matter. As shown in FIG. 6, the BLSETUP signal is driven high so that the sensing node is pulled down to ground level. The BLSLT and BLSHF signals are also both driven high so that the bit line is pulled down to ground level through the isolation transistor SLT and the shut-off transistor SHT.

Referring back to FIG. 3, when the program inhibit voltage on the bit line VBL is relatively low, the voltage on the string selection line SSL may be reduced to be less than the bit line voltage VBL so as to avoid losing programmed data.

Figure 7:
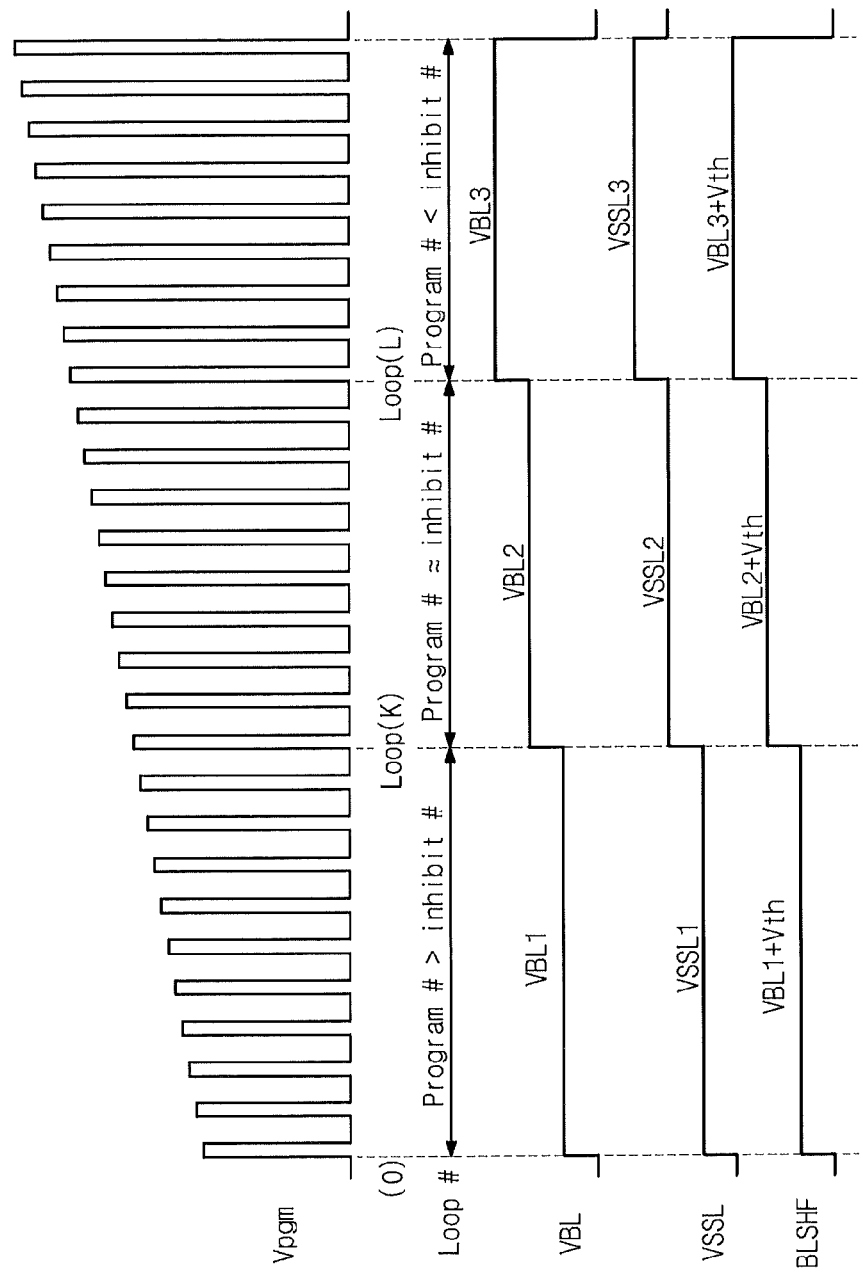
FIG. 7 is a set of waveform diagrams that illustrate programming operations of the nonvolatile memory device of FIG. 3 according to some embodiments of the present inventive subject matter.

FIG. 7 is a set of waveform diagrams that illustrate programming operations of the nonvolatile memory device of FIG. 3 according to some embodiments of the present inventive subject matter. As shown in FIG. 7, during a first subset of the programming loops from loop 0 to loop K–1, the program inhibit voltage is set at a first level VBL1 based on the voltage level of the signal BLSHF. During a second subset of the programming loops from loop K to loop L–1, the program inhibit voltage is increased to VBL2 based on the voltage level of the signal BLSHF. Finally, during a third subset of the programming loops from loop L to the last loop, the program inhibit voltage is increased to VBL3 based on the voltage level of the signal BLSHF. In accordance with various embodiments of the present inventive subject matter, the transition points, i.e., values of K and L, may be set during manufacturing or may be set by the voltage generator/control logic unit 140 of FIG. 3. The string selection voltage level VSSL is shown as increasing in concert with the program inhibit voltage VBL, but in other embodiments, the string selection voltage level VSSL may remain constant.

Figure 8:
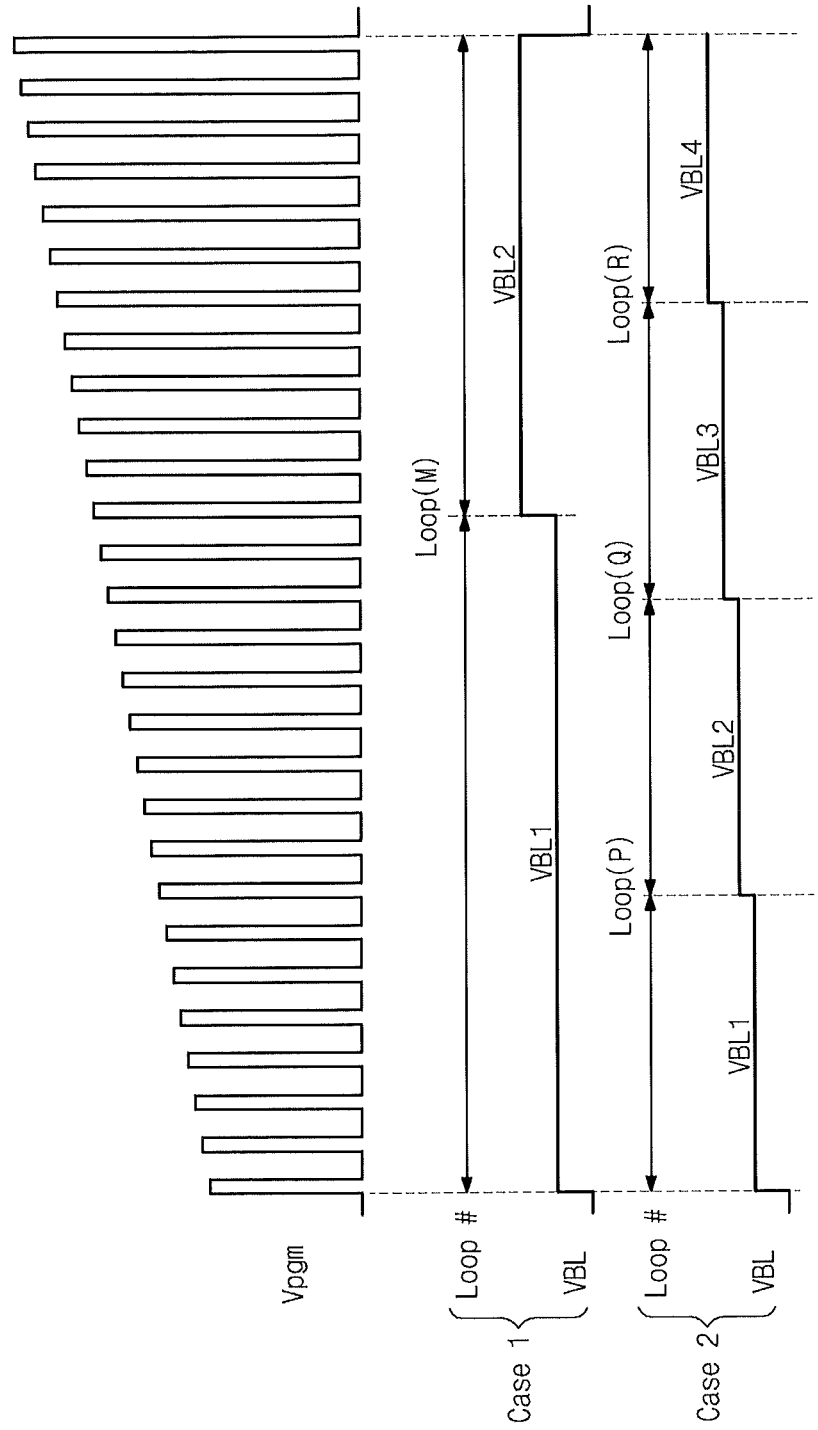
FIG. 8 is a set of waveform diagrams that illustrate programming operations of the nonvolatile memory device of FIG. 3 according to further embodiments of the present inventive subject matter.

FIG. 8 is a set of waveform diagrams that illustrate programming operations of the nonvolatile memory device of FIG. 3 according to further embodiments of the present inventive subject matter. As shown in Case 1 of FIG. 8, the program inhibit voltage may be driven to a first level VBL1 during a first subset of the programming loops from loop 0 to loop M–1 and driven to a second level VBL2 during a second subset of the programming loops from loop M to the last loop. In Case 2 of FIG. 8, the programming loops are divided into four subsets—loop 0 to loop P–1, loop P to loop Q–1, loop Q to loop R–1, and loop R to the last loop—with the program inhibit voltage being driven to values VBL1, VBL2, VBL3, and VBL3 during the four loop subsets, respectively.

Figure 9:
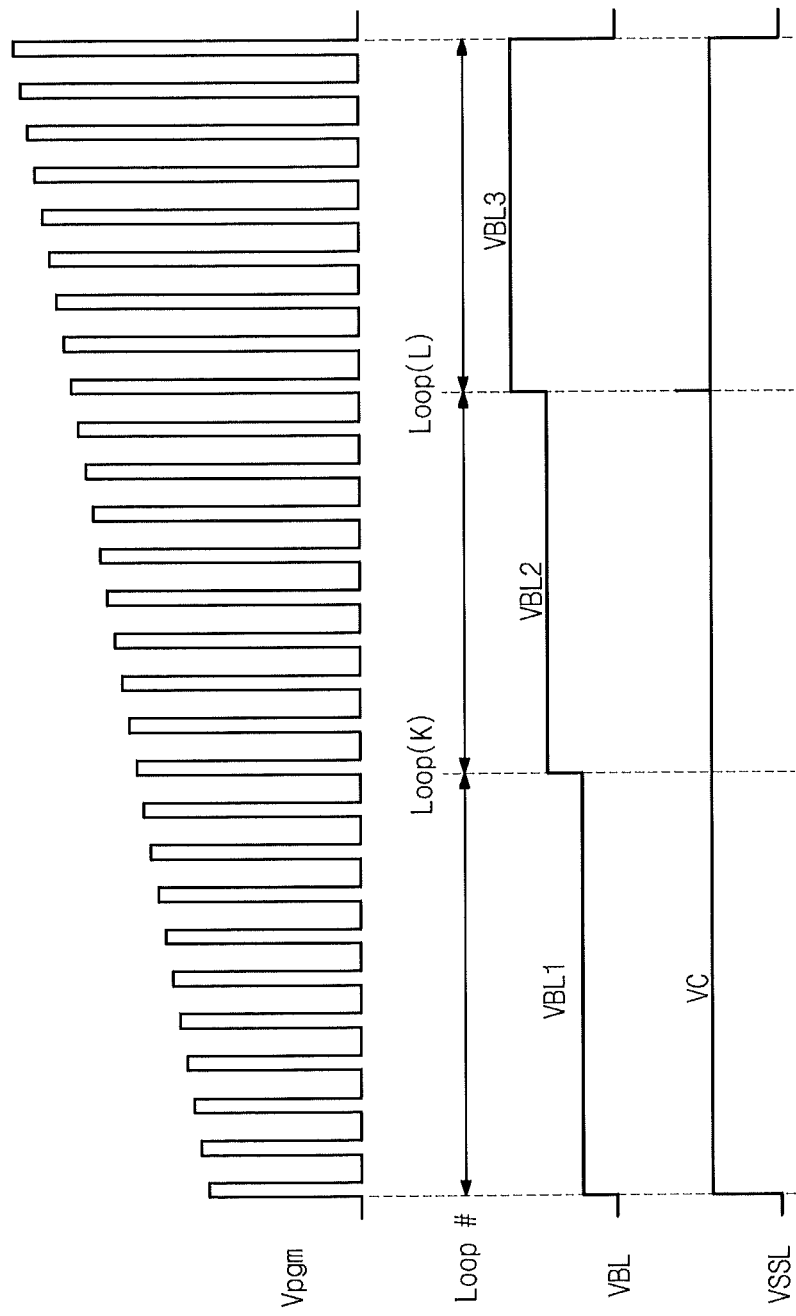
FIG. 9 is a set of waveform diagrams that illustrate programming operations of the nonvolatile memory device of FIG. 3.

FIG. 9 is a set of waveform diagrams that illustrate programming operations of the nonvolatile memory device of FIG. 3 according to further embodiments of the present inventive subject matter. As shown in FIG. 9, the string selection line voltage level VSSL is held approximately constant throughout the programming loops. Generally, the voltage level of the string selection line comes into consideration when the program inhibit voltage level on a bit line is relatively low as the string selection line voltage VSSL may be reduced to be less than bit line voltage VBL.

Figure 10:
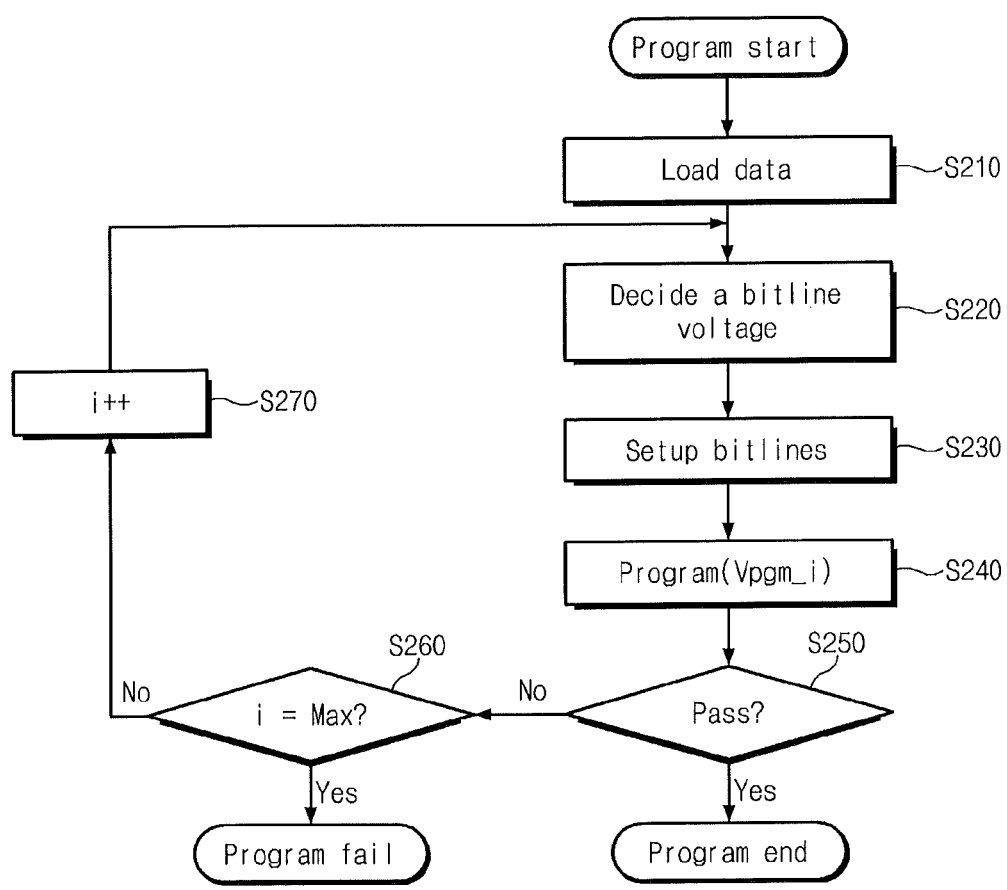
FIG. 10 is a flowchart that illustrates programming methods of the nonvolatile memory device of FIG. 3 according to some embodiments of the inventive subject matter.

FIG. 10 is a flowchart that illustrates programming methods of the nonvolatile memory device of FIG. 3 according to some embodiments of the inventive subject matter. Operations begin at block S210 where data to be programmed is loaded into page buffers PB0~PBn-1. At block S220, a program inhibit bit line voltage is determined for use in the programming loop. The appropriate bit lines are then driven to the determined voltage (ground voltage for cells to be programmed and inhibit voltage for cells already programmed) at block S230 and the program operation is performed at block S240. A verify operation is performed at block S250 and if the verification result is successful the program operation ends. A determination is made at block S260 if this loop is the final programming loop. If this is not the final programming loop, then a loop counter is incremented at block S270 and operations continue at block S220. The voltage generator/control logic 140 determines when to change the bit line voltage to a different value at block S220 based on factors such as, for example, the programming voltage level and/or number of cells to be programmed.

Figure 11:
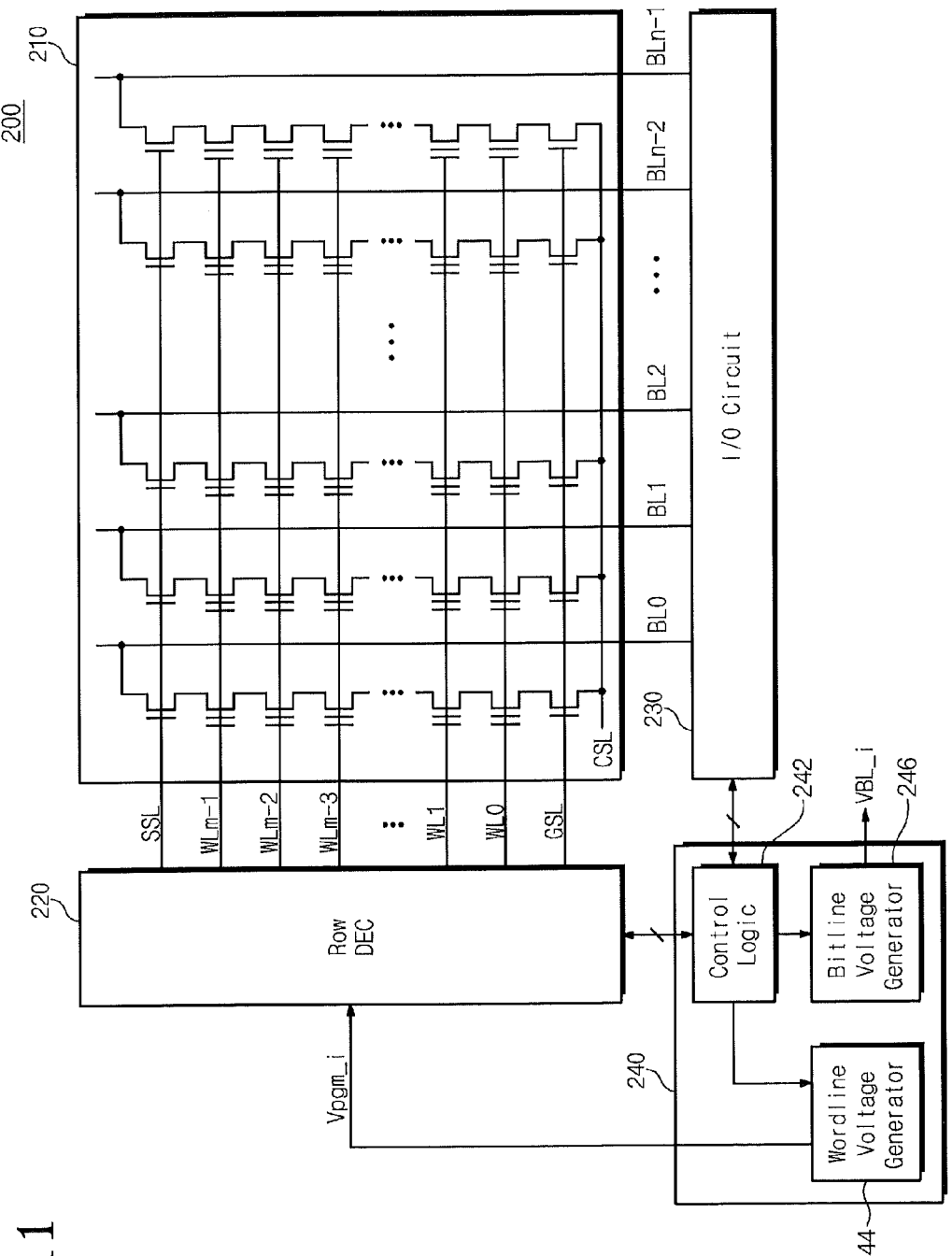
FIG. 11 is a block diagram of a nonvolatile memory device according to further embodiments of the present inventive subject matter.

FIG. 11 is a block diagram of a nonvolatile memory device 200 according to further embodiments of the present inventive subject matter. In FIG. 11, the memory cell array 210, row/address decoder 220, and data input/output circuit 230 are the same as those corresponding components of FIG. 3. The voltage generator/control logic 240, however, is broken into a control logic module 242, which is configured to count program loops and to control the word line and bit line voltage generation, a word line voltage generator 244, which generates the programming voltages, and the bit line voltage generator 246, which generates the program inhibit voltages.

Figure 12:
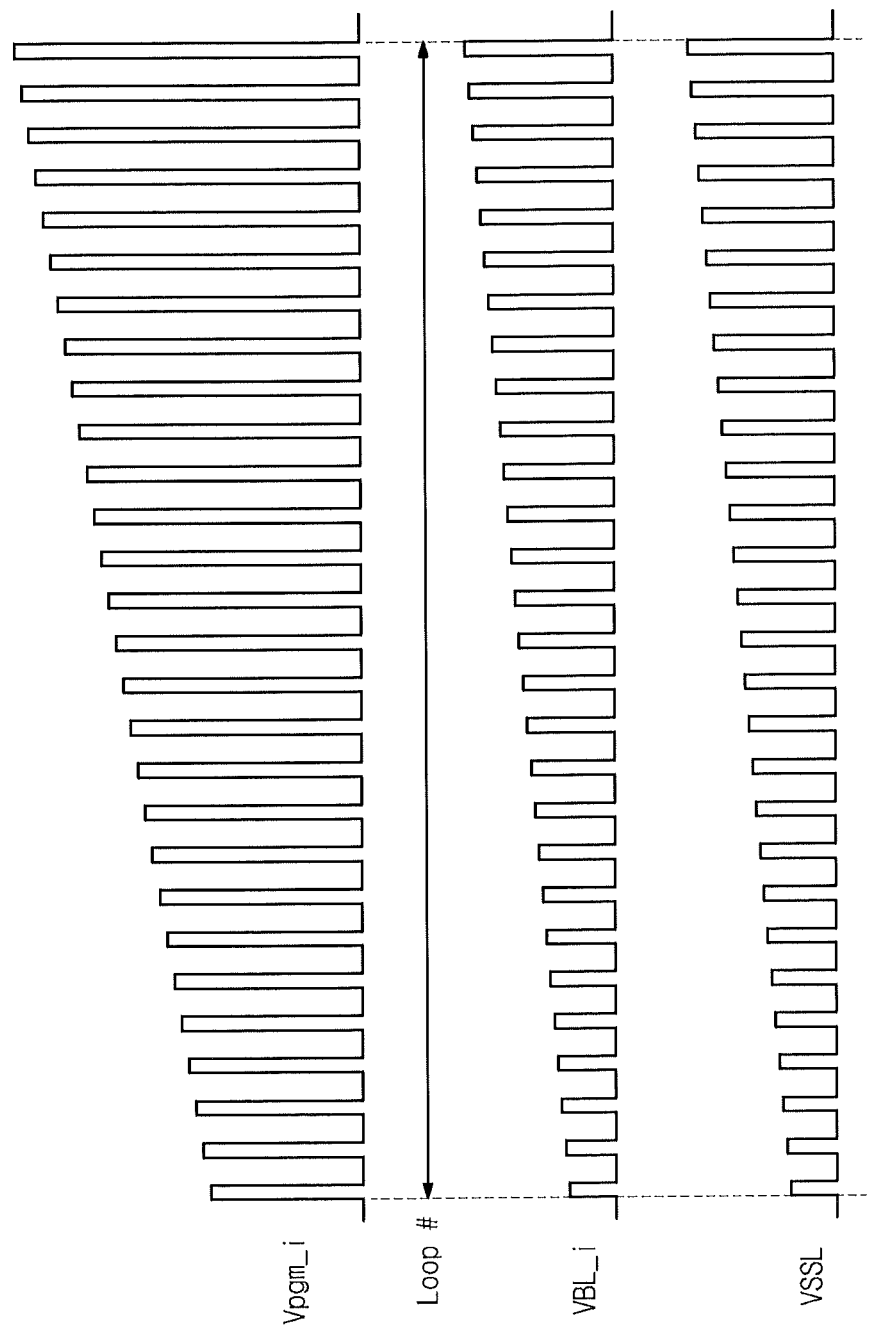
FIG. 12 is a set of waveform diagrams that illustrate programming operations of the memory device of FIG. 11.

FIG. 12 is a set of waveform diagrams that illustrate programming operations of the memory device 200 of FIG. 11. As shown in FIG. 12, the programming voltage Vpgm_i increases with each loop and the program inhibit bit line voltage VBL_i also increases at the same frequency as the programming loop count. In the example shown in FIG. 12, the string selection line voltage VSSL also increases at the same frequency as the programming loop count.

Figure 13:
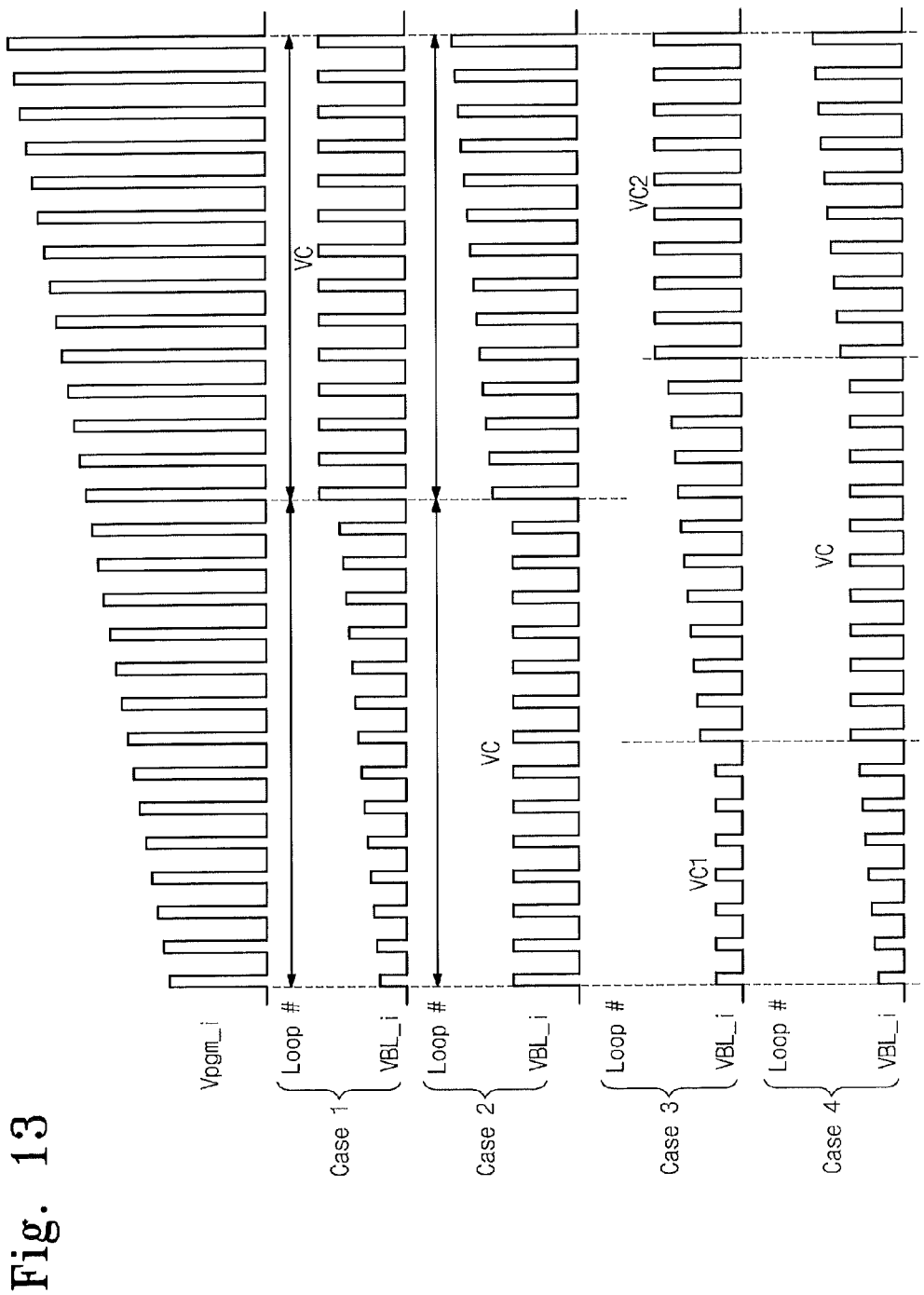
FIG. 13 is a set of waveform diagrams that illustrate programming operations of the nonvolatile memory device of FIG. 11 according to some embodiments of the present inventive subject matter.

FIG. 13 is a set of waveform diagrams that illustrate programming operations of the nonvolatile memory device 200 of FIG. 11 according to some embodiments of the present inventive subject matter. As shown in Case 1 of FIG. 13, the program inhibit bit line voltage VBL_i may increase during a first subset of the programming loops and then remain substantially constant. As shown in Case 2 of FIG. 13, the program inhibit bit line voltage VBL_i may remain substantially constant during a first subset of the programming loops and increase during a second subset of the programming loops. The control logic 242 may determine when to change the program inhibit bit line voltage based on the loop count. As shown in Case 3 of FIG. 13, the program inhibit bit line voltage VBL_i may remain substantially constant during a first subset of the programming loops, increase during a second subset of the programming loops, and remain substantially constant during a third subset of the programming loops. The control logic 242 may determine the transition points between increasing the program inhibit bit line voltage and keeping the program inhibit bit line voltage constant based on the loop count. Finally, in case 4 of FIG. 13 the program inhibit bit line voltage VBL_i may increase during a first subset of the programming loops, may remain substantially constant during a second subset of the programming loops, and may increase during a third subset of the programming loops. The control logic 242 may determine the transition points between increasing the program inhibit bit line voltage and keeping the program inhibit bit line voltage constant based on the loop count.

As shown above in FIG. 9, the string selection voltage VSSL may increase as the programming loop count increases or may remain substantially constant in accordance with various embodiments of the present inventive subject matter.

Figure 14:
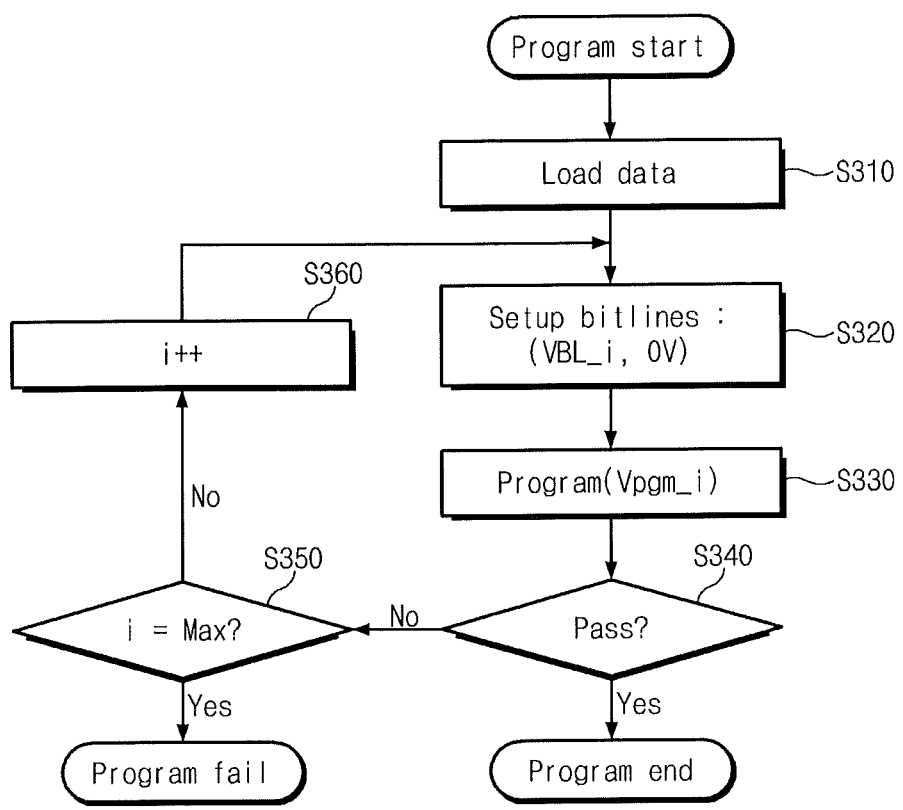
FIG. 14 is a flowchart that illustrates programming methods of the nonvolatile memory device of FIG. 11 according to some embodiments of the inventive subject matter.

FIG. 14 is a flowchart that illustrates programming methods of the nonvolatile memory device of FIG. 11 according to some embodiments of the inventive subject matter. Operations begin at block S310 where data to be programmed is loaded into page buffers PB0~PBn-1. At block S320, a program inhibit bit line voltage is determined for use in the programming loop or the ground voltage is applied to bit lines having a cell to be programmed. The program operation is then performed at block S330. A verify operation is performed at block S340 and if the verification result is successful the program operation ends. A determination is made at block S350 if this loop is the final programming loop. If this is not the final programming loop, then a loop counter is incremented at block S370 and operations continue at block S320. The control logic 242 determines when to change the bit line voltage to a different value at block S320 based on factors such as, for example, the programming voltage level and/or number of cells to be programmed.

Figure 15:
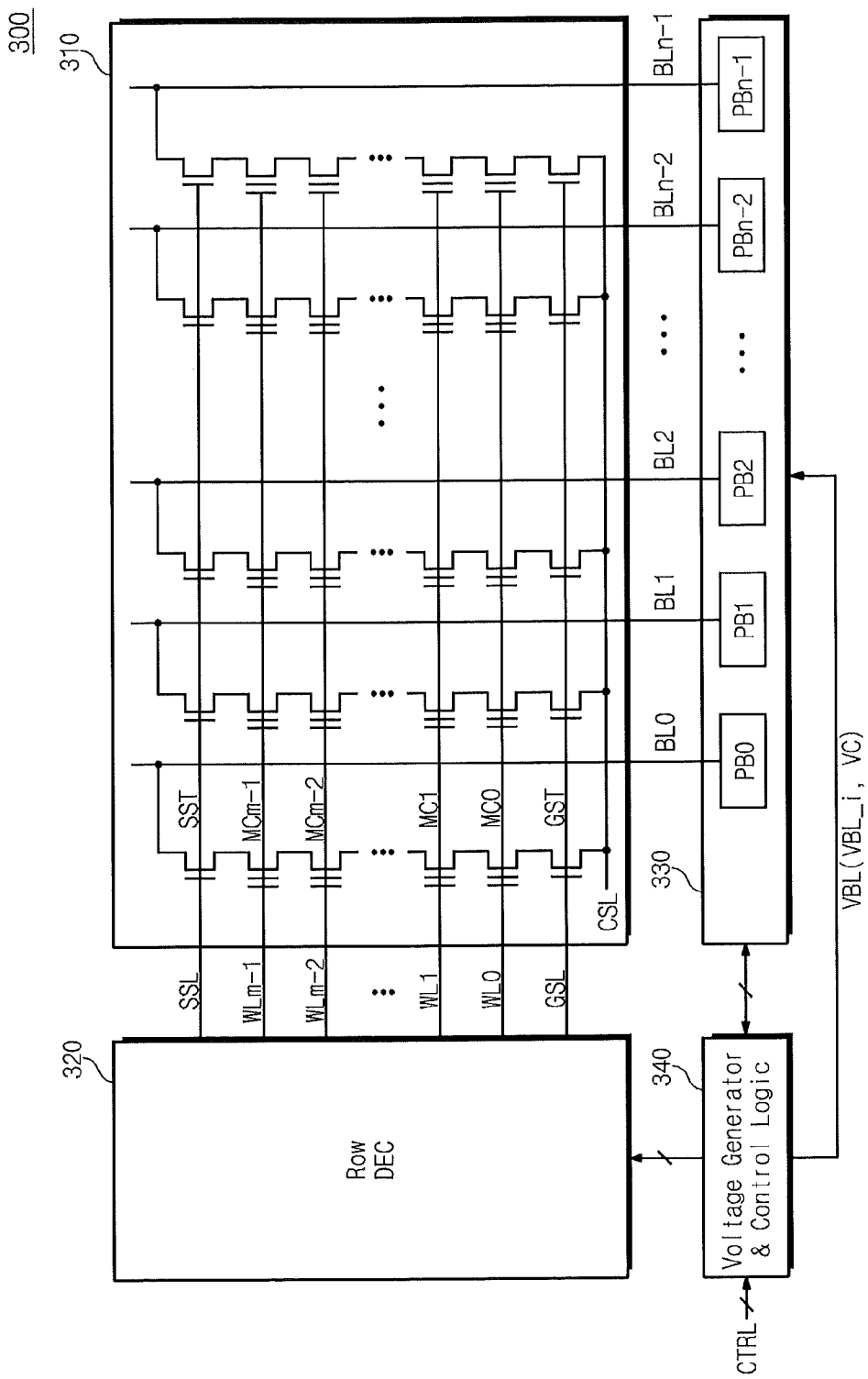
FIG. 15 is a block diagram of a nonvolatile memory device according to further embodiments of the present inventive subject matter.

FIG. 15 is a block diagram of a nonvolatile memory device 300 according to further embodiments of the present inventive subject matter. In FIG. 15, the memory cell array 310, row/address decoder 320, and data input/output circuit 330 are the same as those corresponding components of FIGS. 3 and 11. The voltage generator/control logic module 340 of FIG. 15 is configured to determine a count of a number of memory cells of the cell array 310 to be programmed. If the number of cells to be programmed exceeds a threshold, then the program inhibit bit line voltage VBL_i may be varied one or more times during performance of the programming loops. If, however, the number of cells to be programmed does not exceed the threshold, then the program inhibit bit line voltage is set to a constant value VC.

Figure 16:
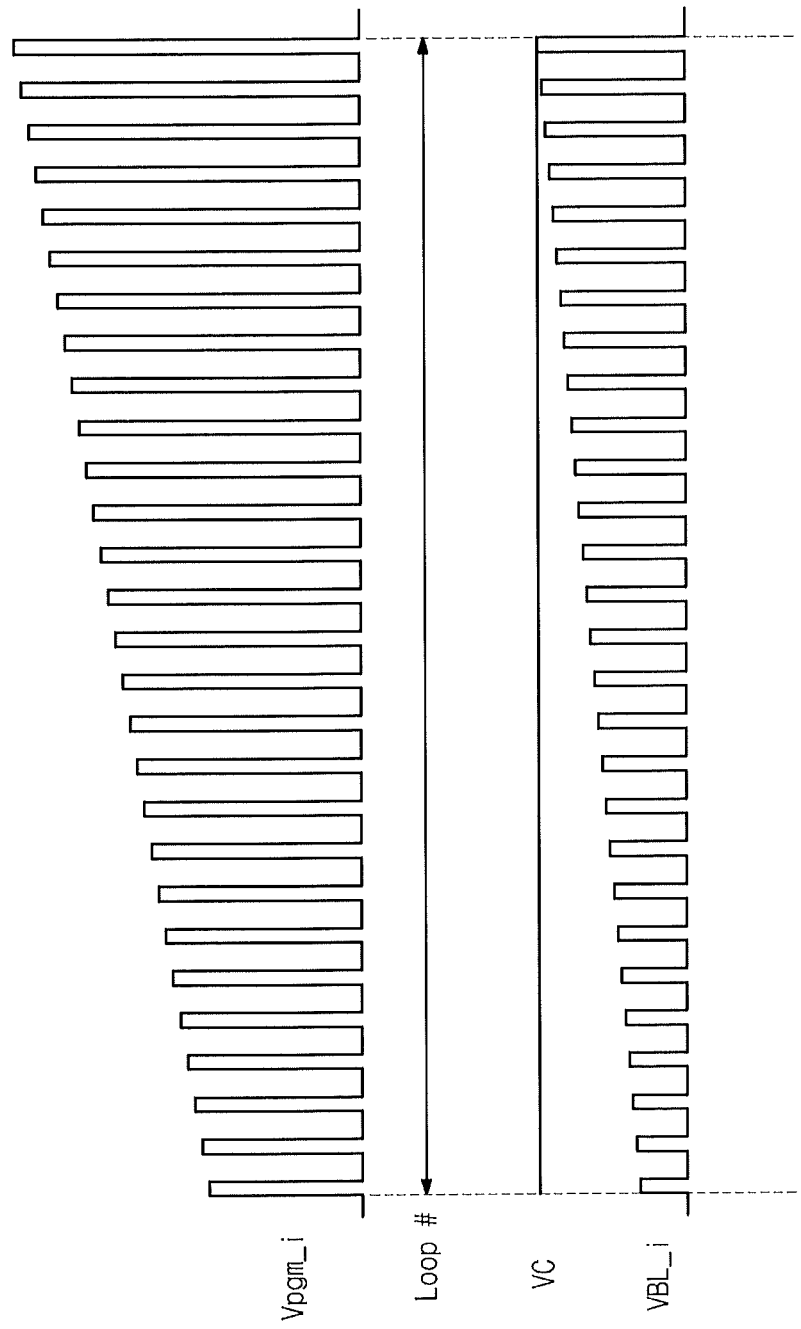
FIG. 16 is a set of waveform diagrams that illustrate programming operations of the nonvolatile memory device of FIG. 15.

FIG. 16 is a set of waveform diagrams that illustrate programming operations of the nonvolatile memory device 300 of FIG. 15. As shown in FIG. 16, the program inhibit bit line voltage VBL_i may increase in synchronization with the programming loops if the number of cells to be programmed exceeds a threshold or, alternatively, the program inhibit bit line voltage may be set to a constant value VC if the number of cells to be programmed does not exceed a threshold.

Figure 17:
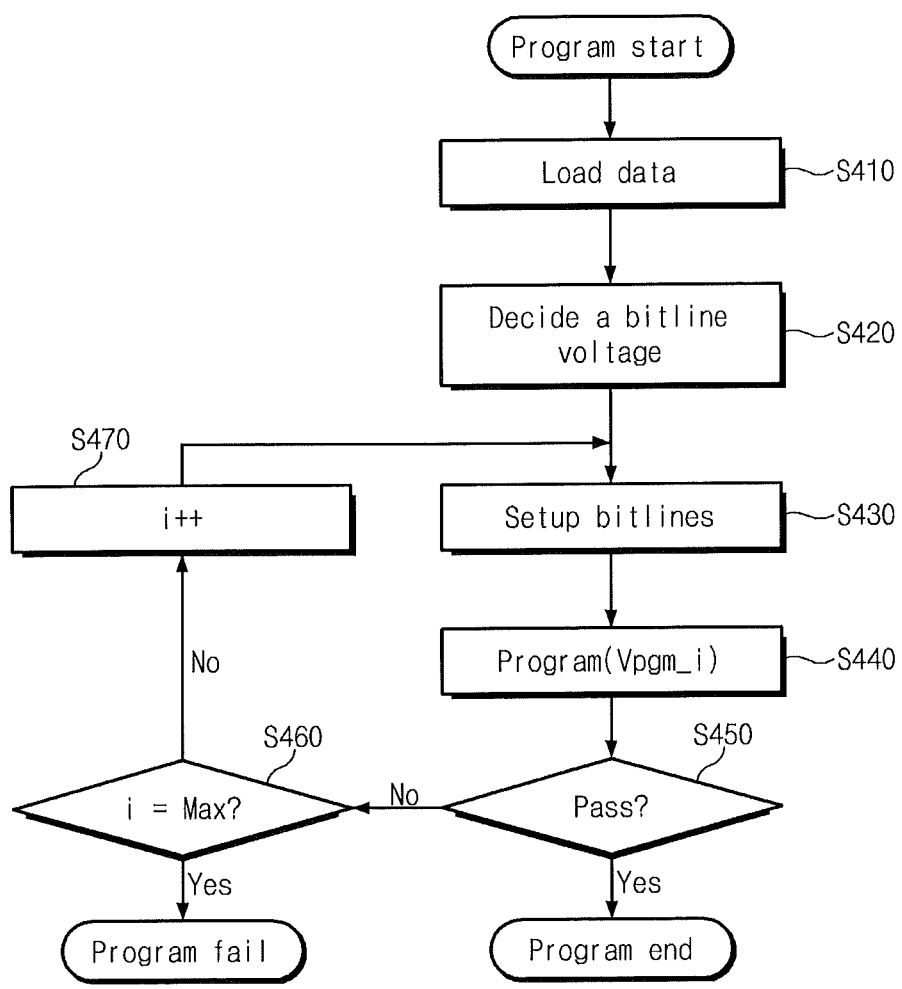
FIG. 17 is a flowchart that illustrates programming methods of the nonvolatile memory device of FIG. 15 according to some embodiments of the inventive subject matter.

FIG. 17 is a flowchart that illustrates programming methods of the nonvolatile memory device of FIG. 15 according to some embodiments of the inventive subject matter. Operations begin at block S410 where data to be programmed is loaded into page buffers PB0~PBn-1. At block S420, a program inhibit bit line voltage is determined for use in the programming loop based on whether a number of cells to be programmed exceeds a threshold as described above with respect to FIGS. 15 and 16. The program inhibit bit line voltage may either be incremented in concert with the programming loops or held substantially constant. The appropriate bit lines are then driven to the determined voltage at block S430 (ground voltage for cells to be programmed and inhibit voltage for cells already programmed) and the program operation is performed at block S440. A verify operation is performed at block S450 and if the verification result is successful the program operation ends. A determination is made at block S460 if this loop is the final programming loop. If this is not the final programming loop, then a loop counter is incremented at block S470 and operations continue at block S420. The voltage generator/control logic 140 determines when to change the bit line voltage to a different value at block S220 based on factors such as, for example, the programming voltage level and/or number of cells to be programmed.

The nonvolatile memory devices according to the embodiments of the present inventive subject matter can be used or applied in various products. The nonvolatile memory devices according to some embodiments of the present invention can be implemented not only in electronic devices such as, but not limited to, personal computers, digital cameras, camcorders, game consoles, televisions, DVD players, routers, GPS systems, portable phones, MP3, PMP, PSP, and Personal Digital Assistants (PDAs), but also in storage devices such as memory cards, USB memories, and solid state drives (SSDs).

Figure 18:
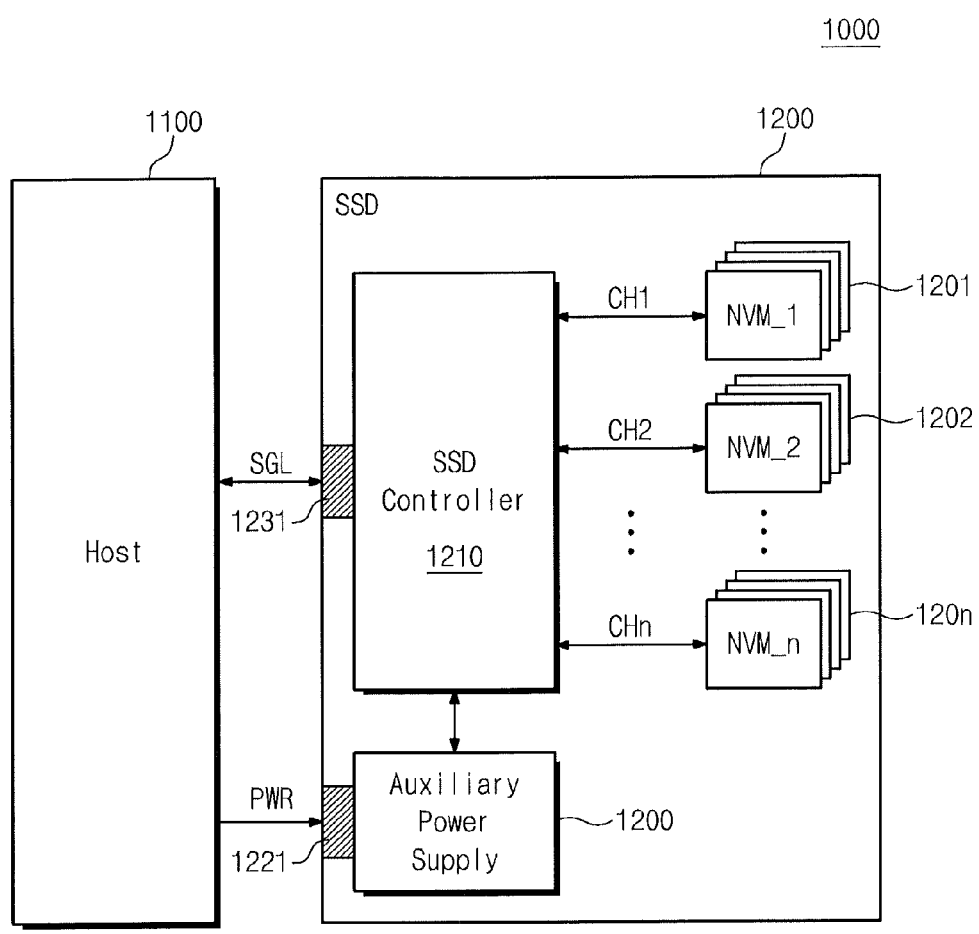
FIG. 18 is a block diagram of a solid state drive (SSD) system including a nonvolatile memory device according to some embodiments of the present inventive subject matter.

FIG. 18 is a block diagram of a solid state drive (SSD) system including a nonvolatile memory device according to some embodiments of the present invention.

Referring to FIG. 18, an SSD system 1000 includes a host 1100 and an SSD 1200. The SSD 1200 communicates signals with the host 1100 through a signal connector 1231, and receives power through a power connector 1221. The SSD 1200 includes a plurality of nonvolatile memory (NVM) devices 1201~120n, an SSD controller 1210, and an auxiliary power supply 1220.

The nonvolatile memory devices 1201~120n are used as a storage medium of the SSD 1200. The nonvolatile memory devices 1201~120n may be implemented using a flash memory device with a large storage capacity. The SSD 1200 generally uses flash memories, and may also use other nonvolatile memory devices such as PRAMs, MRAMs, ReRAMs, and FRAMs.

In FIG. 18, at least one nonvolatile memory device may include the nonvolatile memory device 100, 200, or 300 illustrated in FIG. 1, FIG. 11, or FIG. 15.

The nonvolatile memory devices 1201~120n may be connected through a plurality of channel CH1~CHn to the SSD controller 1210. One or more memory devices may be connected to each channel. The memory devices connected to one channel may be connected to the same data bus.

The SSD controller 1210 communicates signals SGL with the host 1100 through the signal connector 1231. Herein, the signals SGL may include commands, addresses, and data. According to the commands of the host 1100, the SSD controller 1210 writes/reads data in/from the corresponding memory devices. The internal structure of the SSD controller 1210 will be described later in detail with reference to FIG. 36.

The auxiliary power supply 1220 is connected through the power connector 121 to the host 1100. The auxiliary power supply 1220 may be charged by receiving power PWR from the host 1100. The auxiliary power supply 1220 may be located in or outside the SSD 1200. For example, the auxiliary power supply 1220 may be located in the main board to supply auxiliary power to the SSD 1220.

Figure 19:
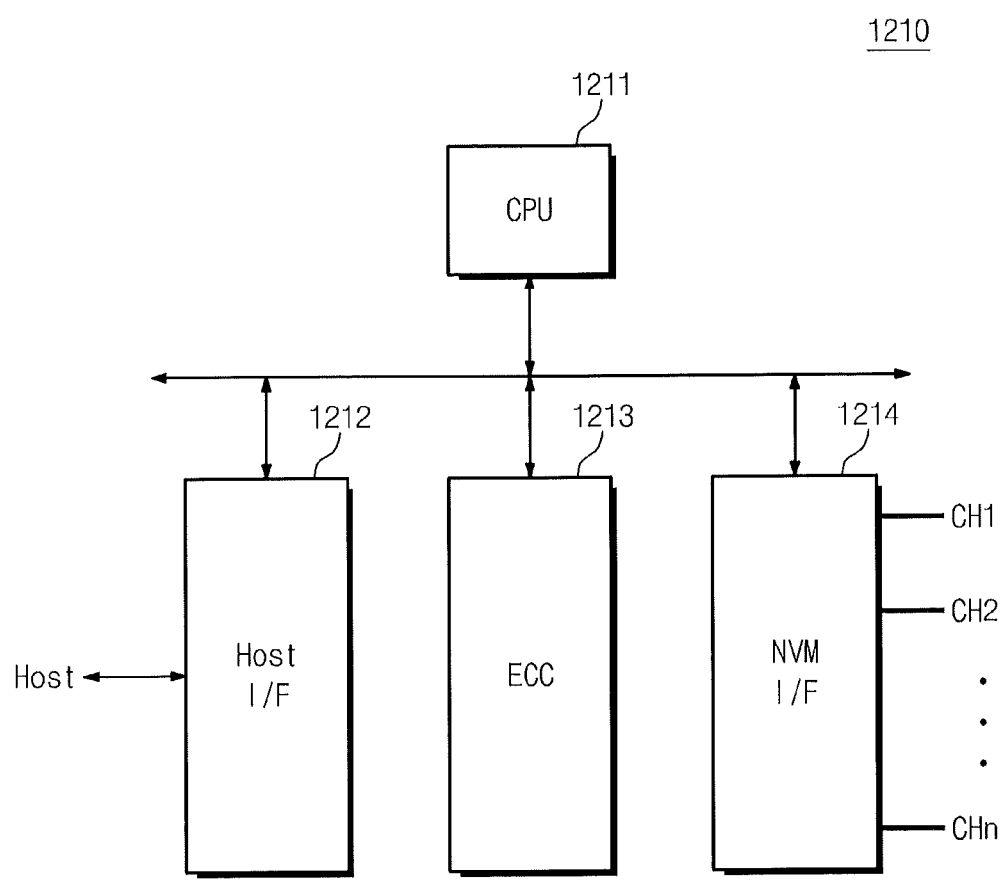
FIG. 19 is a block diagram of an SSD controller illustrated in FIG. 18.

FIG. 19 is a block diagram of the SSD controller 1210 illustrated in FIG. 18.

Referring to FIG. 19, the SSD controller 1210 includes a central processing unit (CPU) 1211, a host interface 1212, a volatile memory (VM) 1213, and an NVM interface 1214.

The CPU 1211 analyzes and processes signals SGL received from the host 1100. The CPU 1211 controls the host 1100 or the nonvolatile memory devices 1201~120n through the host interface 1212 or the NVM interface 1214. The CPU 1211 controls the operations of the nonvolatile memory devices 1201~120n according to the firmware for driving the SSD 1200.

The host interface 1212 provides an interface with the SSD 1200 in accordance with the protocol of the host 1100. The host interface 1212 may communicate with the host 1100 by means of Universal Serial Bus (USB), Small Computer System Interface (SCSI), PCI Express, ATA, Parallel ATA (PATA), Serial ATA (SATA), Serial Attached SCSI (SAS), etc. Also, the host interface 1212 may perform a disk emulation function that assists the host 1100 to recognize the SSD 1200 as a hard disk drive (HDD).

The VM 1213 temporarily stores the write data received from the host 1100 or the data read from the NVM devices. The VM 1213 may store cache data or metadata to be stored in the NVM devices 1201~120n. In a sudden power-off operation, cache data or metadata stored in the VM 1213 are stored in the NVM devices 1201~120n. Examples of the VM 1213 include DRAMs and SRAMs.

The NVM interface 1214 scatters data, which are received from the VM 1213, over the respective channels CH1~CHn. The NVM interface 1214 transfers data, which are read from the NVM devices 1201~120n, to the VM 1213. Herein, the NVM interface 1214 may use the interface protocol of a NAND flash memory. That is, the SSD controller 1210 may perform a program/read/erase operation according to the interface protocol of an NAND flash memory.

Figure 20:
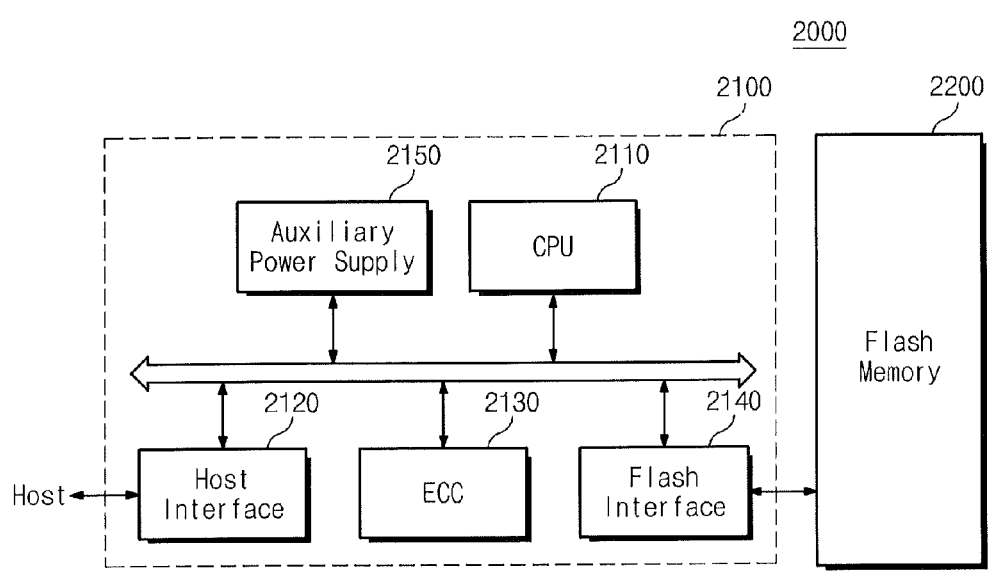
FIG. 20 is a block diagram of a data storage system including a nonvolatile memory device according to some embodiments of the present inventive subject matter.

FIG. 20 is a block diagram of a data storage including a nonvolatile memory device according to some embodiments of the present inventive subject matter.

Referring to FIG. 20, a data storage 2000 includes a memory controller 2100 and a flash memory 2200. Examples of the data storage 2000 include storage media such as portable mobile storages (e.g., USB memories) and memory cards (e.g., SDs and MMCs).

The memory controller 2100 includes a CPU 2110, a host interface 2120, a random access memory (RAM) 2130, a flash interface 2140, and an auxiliary power supply 2150. The auxiliary power supply 2150 may be located in or outside the memory controller 2100.

The data storage 2000 is connected to a host for use. The data storage 2000 communicates data with the host through the host interface 2120, and communicates data with the flash memory 2200 through the flash interface 2140. The data storage 2000 receives power from the host to perform an internal operation.

The flash memory 2200 of FIG. 20 may change a program inhibit voltage applied to bit lines of the memory cells that have completed programming while performing the programming loops during a program operation.

Figure 21:
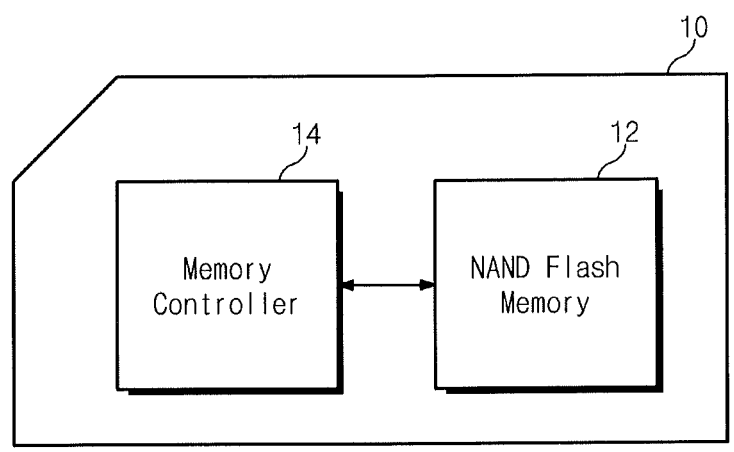
FIG. 21 is a diagram illustrating the external shape of a memory card including a nonvolatile memory device according to some embodiments of the present inventive subject matter.

FIG. 21 is a diagram illustrating the external shape of a memory card including a nonvolatile memory device according to some embodiments of the present inventive subject matter. FIG. 21 illustrates the external shape of an SD card among memory cards.

Referring to FIG. 21, the SD card includes 9 pins. The SD card has 4 data pins (e.g., 1, 7, 8 and 9), one command pin (e.g., 2), one clock pin (e.g., 5), and 3 power pins (e.g., 3, 4 and 6).

Herein, command signals or response signals are transferred through the command pin 2. In general, command signals are transmitted from a host to the memory card, and response signals are transmitted from the memory card to the host.

Figure 22:
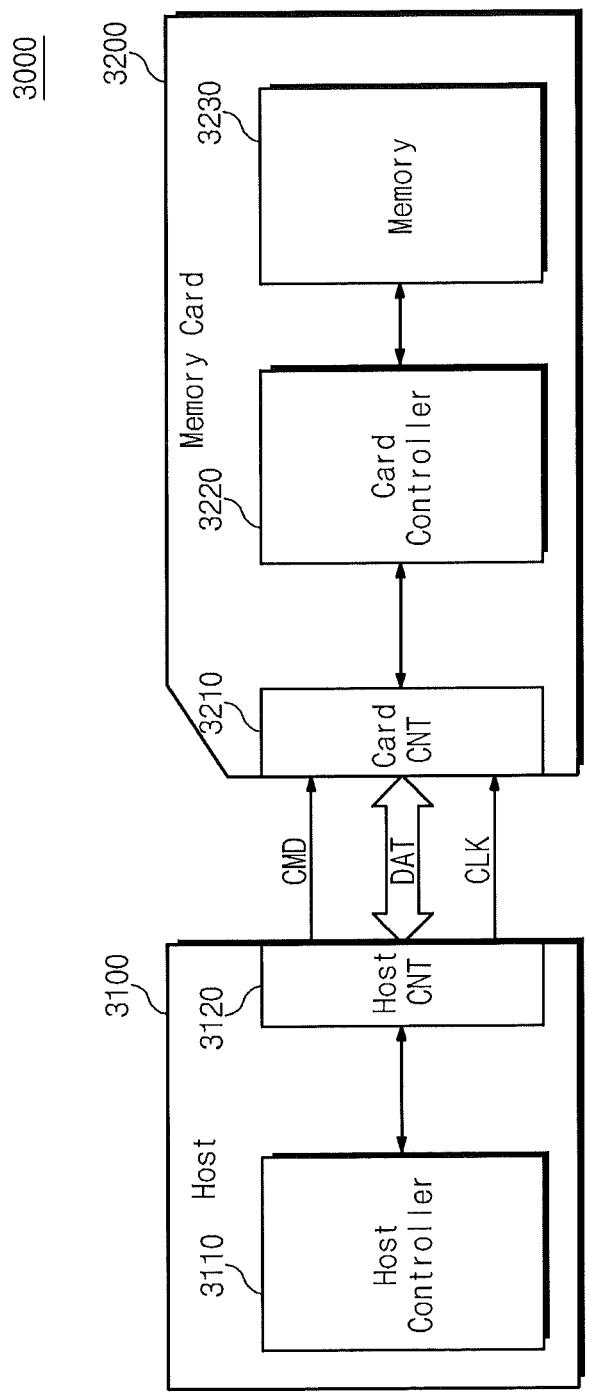
FIG. 22 is a block diagram illustrating the host-related connection and the configuration of the memory card illustrated in FIG. 21.

FIG. 22 is a block diagram illustrating the host-related connection and the configuration of the memory card illustrated in FIG. 21.

Referring to FIG. 22, a memory card system 3000 includes a host 3100 and a memory card 3200. The host 3100 includes a host controller 3110 and a host connection unit 3120. The memory card 3200 includes a card connection unit 3210, a card controller 3220, and a memory 3230.

The host connection unit 3120 and the card connection unit 3210 include a plurality of pins, examples of which include command pins, data pins, clock pins, and power pins. The number of pins depends on the type of the memory card 3200. For example, an SD card has 9 pins.

The host 3100 writes/reads data in/from the memory card 3200. The host controller 3110 transmits a command (e.g., a write command), a clock signal CLK generated by a clock generator (not illustrated) in the host 3100, and data DAT through the host connection unit 3120 to the memory card 3200.

The card controller 3220 stores data in the memory 3230, in response to a write command received through the card connection unit 3210, in synchronization with a clock signal generated by a clock generator (not illustrated) in the card controller 3220. For example, if the host 3100 is a digital camera, image data are stored in the memory 3230.

Herein, the memory 3230 includes the nonvolatile memory device illustrated in FIG. 1, FIG. 11, or FIG. 15. The memory 3230 may change the program inhibit voltage applied to bit lines of the memory cells that have completed programming while performing programming loops during a program operation.

Figure 23:
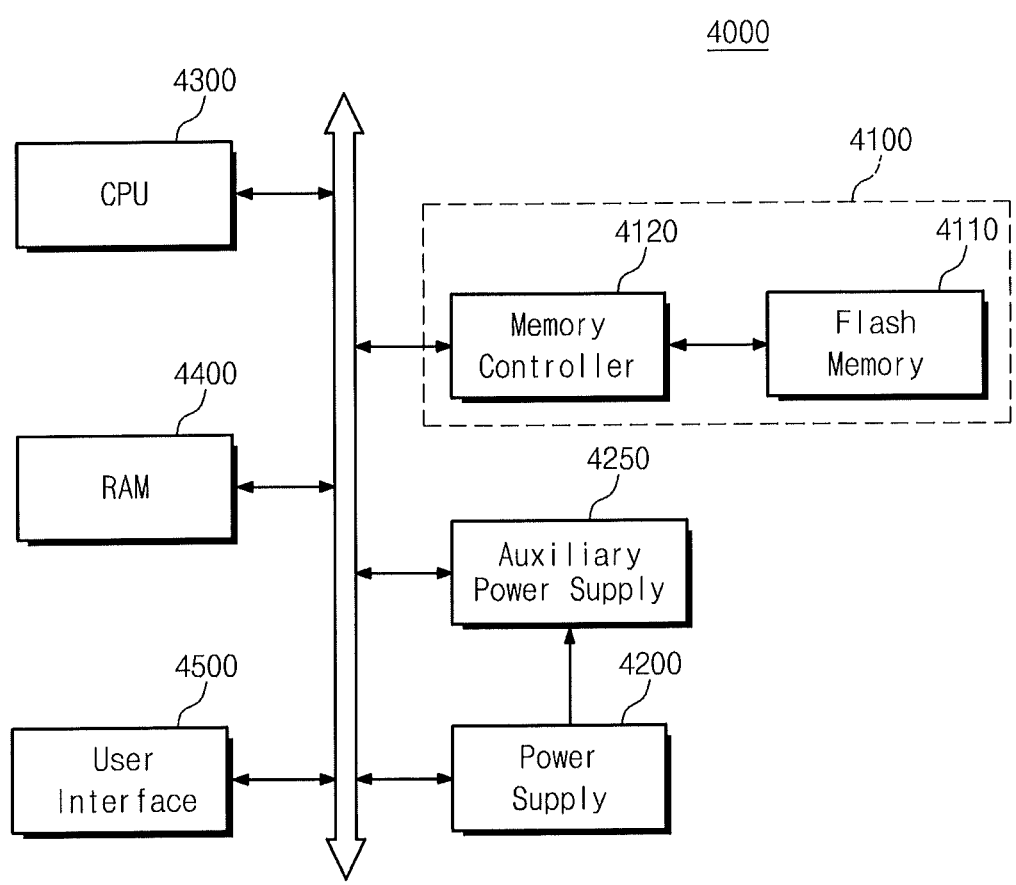
FIG. 23 is a block diagram of an electronic apparatus including a nonvolatile memory device according to some embodiments of the present inventive subject matter.

FIG. 23 is a block diagram of an electronic apparatus 4000 including a nonvolatile memory device according to some embodiments of the present invention. The electronic apparatus 4000 may include a personal computer (PC) or portable electronic devices such as notebook computers, portable phones, PDAs, and cameras.

Referring to FIG. 23, the electronic apparatus 4000 includes a semiconductor memory device 4100, a power supply 4200, an auxiliary power supply 4250, a CPU 4300, a RAM 4400, and a user interface 4500. The semiconductor memory device 4100 includes a flash memory 4110 and a memory controller 4120.

The flash memory 4110 of FIG. 23 may change the program inhibit voltage applied to bit lines of the memory cells that have completed programming while performing programming loops during a program operation.

As described above, nonvolatile memory devices according to some embodiments of the present invention may reduce power consumption without reducing accuracy during program-verify operations by changing the program inhibit voltage used to drive bit lines for cells having been previously programmed such that lower voltages are used when possible, such as when the programming voltage is relatively low.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

That which is claimed:

1. A method of programming a non-volatile memory device, comprising:
    performing a plurality of programming loops on memory cells in a memory cell array; and
    changing a program inhibit voltage applied to bit lines of the memory cells that have completed programming while performing the plurality of programming loops;
    wherein the program inhibit voltage assumes at least two different values for at least two different ones of the programming loops, respectively; and
    wherein the program inhibit voltage remains a constant value when a programming loop counter is greater than a predetermined count value.

2. The method of claim 1, wherein changing the program inhibit voltage comprises:
    increasing the program inhibit voltage applied to the bit lines of the memory cells that have completed programming.

3. The method of claim 1, wherein each of the bit lines of the memory cells has a bit line shut-off transistor coupled thereto and wherein changing the program inhibit voltage comprises:
    changing a voltage (BLSHF) applied to respective gates of ones of the bit line shut-off transistors such that the program inhibit voltage is driven to BLSHF minus a threshold voltage (Vth) of respective ones of the bit line shut-off transistors.

4. The method of claim 1, wherein each of the bit lines of the memory cells has a string selection transistor coupled thereto, the method further comprising:
    setting a string selection voltage (VSSL) applied to respective gates of ones of the string selection transistors to a level lower than the program inhibit voltage applied to the bit lines coupled to the string selection transistors, respectively.

5. The method of claim 1, wherein changing the program inhibit voltage comprises:
    changing the program inhibit voltage based on a number of memory cells that have completed programming.

6. The method of claim 1, wherein the program inhibit voltage is less than an internal power supply voltage used in the non-volatile memory device.

7. The method of claim 1, wherein the program inhibit voltage is a first value during the performance of a first subset of the plurality of programming loops and the program inhibit voltage is a second value during the performance of a second subset of the plurality of programming loops; and
    wherein the second subset of the plurality of programming loops is performed subsequent to the first subset of the plurality of programming loops and the second program inhibit voltage value is greater than the first program inhibit voltage value.

8. The method of claim 1, wherein changing the program inhibit voltage comprises:
    changing the program inhibit voltage one time while performing the plurality of programming loops.

9. The method of claim 1, wherein changing the program inhibit voltage comprises:
    changing the program inhibit voltage multiple times while performing the plurality of programming loops.

10. The method of claim 9, wherein changing the program inhibit voltage comprises:
    increasing the program inhibit voltage while performing the plurality of programming loops at a frequency corresponding to increases in a programming voltage during performance of the plurality of programming loops.

11. The method of claim 9, wherein changing the program inhibit voltage comprises:
increasing the program inhibit voltage during the performance of a first subset of the plurality of programming loops; and
maintaining the program inhibit voltage at approximately a same value during the performance of a second subset of the plurality of programming loops;
wherein the second subset of the plurality of programming loops is performed subsequent to the first subset of the plurality of programming loops.

12. The method of claim 11, wherein increasing the program inhibit voltage comprises increasing the program inhibit voltage during performance of the first subset of the plurality of programming loops at a frequency corresponding to increases in a programming voltage during performance of the first subset of the plurality of programming loops.

13. The method of claim 9, wherein changing the program inhibit voltage comprises:
maintaining the program inhibit voltage at approximately a same value during the performance of a first subset of the plurality of programming loops; and
increasing the program inhibit voltage during the performance of a second subset of the plurality of programming loops;
wherein the second subset of the plurality of programming loops is performed subsequent to the first subset of the plurality of programming loops.

14. The method of claim 13, wherein increasing the program inhibit voltage comprises increasing the program inhibit voltage during performance of the second subset of the plurality of programming loops at a frequency corresponding to increases in a programming voltage during performance of the second subset of the plurality of programming loops.

15. The method of claim 9, wherein changing the program inhibit voltage comprises:
maintaining the program inhibit voltage at approximately a first same value during the performance of a first subset of the plurality of programming loops;
increasing the program inhibit voltage during the performance of a second subset of the plurality of programming loops; and
maintaining the program inhibit voltage at approximately a second same value during the performance of a third subset of the plurality of programming loops;
wherein the third subset of the plurality of programming loops is performed subsequent to the second subset of the plurality of programming loops, which is performed subsequent to the first subset of the plurality of programming loops.

16. The method of claim 15, wherein increasing the program inhibit voltage comprises increasing the program inhibit voltage during performance of the second subset of the plurality of programming loops at a frequency corresponding to increases in a programming voltage during performance of the second subset of the plurality of programming loops.

17. The method of claim 9, wherein changing the program inhibit voltage comprises:
increasing the program inhibit voltage during the performance of a first subset of the plurality of programming loops;
maintaining the program inhibit voltage at approximately a same value during the performance of a second subset of the plurality of programming loops; and
increasing the program inhibit voltage during the performance of a third subset of the plurality of programming loops;
wherein the third subset of the plurality of programming loops is performance subsequent to the second subset of the plurality of programming loops, which is performed subsequent to the first subset of the plurality of programming loops.

18. The method of claim 17, wherein increasing the program inhibit voltage during the performance of the first subset of the plurality of programming loops comprises increasing the program inhibit voltage during performance of the first subset of the plurality of programming loops at a frequency corresponding to increases in a programming voltage during performance of the first subset of the plurality of programming loops; and
wherein increasing the program inhibit voltage during the performance of the third subset of the plurality of programming loops comprises increasing the program inhibit voltage during performance of the third subset of the plurality of programming loops at a frequency corresponding to increases in a programming voltage during performance of the third subset of the plurality of programming loops.

19. The method of claim 1, further comprising:
determining a number of the memory cells to be programmed;
wherein changing the program inhibit voltage comprises changing the program inhibit voltage when the number of memory cells to be programmed exceeds a threshold.

20. A memory system, comprising:
a non-volatile memory cell array; and
a control logic unit that is configured to cause a plurality of programming loops to be performed on memory cells of the memory cell array and to change a program inhibit voltage applied to bit lines of the memory cells that have completed programming while the plurality of programming loops are performed;
wherein the program inhibit voltage assumes at least two different values for at least two different ones of the programming loops, respectively; and
wherein the program inhibit voltage remains a constant value when a programming loop counter is greater than a predetermined count value.

21. The memory system of claim 20, wherein each of the bit lines of the memory cells has a bit line shut-off transistor coupled thereto and wherein the control logic unit is further configured to change the program inhibit voltage by changing a voltage (BLSHF) applied to respective gates of ones of the bit line shut-off transistors such that the program inhibit voltage is driven to BLSHF minus a threshold voltage (Vth) of respective ones of the bit line shut-off transistors.

22. The memory system of claim 20, wherein the memory cell array is part of a flash memory.

23. The memory system of claim 22, wherein the flash memory comprises a NAND, NOR, or a One_NAND type flash memory.

24. The memory system of claim 20, wherein the memory system is embodied in a memory card device, Solid State Drive (SSD) device, ATA bus device, Serial ATA (SATA) bus device, Small Computer System Interface (SCSI) device, Serial Attached SCSI (SAS) device, Multi-Media Card (MMC) device, Secure Digital (SD) device, memory stick device, Hard Disk Drive (HDD) device, Hybrid Hard Drive (HHD) device, or a Universal Serial Bus (USB) flash drive device.

25. The memory system of claim 20, wherein the memory system is embodied in a graphics card, a computer, a mobile terminal, a Personal Digital Assistant (PDA), a camera, a game console, an MP3 player, a television, a DVD player, a router, or a GPS system.

\* \* \* \* \*